(12) United States Patent
Miyasaka et al.

(10) Patent No.: US 9,679,767 B2
(45) Date of Patent: Jun. 13, 2017

(54) SIC EPITAXIAL WAFER AND METHOD FOR MANUFACTURING THE SAME

(71) Applicant: SHOWA DENKO K.K., Minato-ku, Tokyo (JP)

(72) Inventors: Akira Miyasaka, Chichibu (JP); Yutaka Tajima, Chichibu (JP); Yoshiaki Kageshima, Chichibu (JP); Daisuke Muto, Chichibu (JP); Kenji Momose, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 112 days.

(21) Appl. No.: 14/407,397

(22) PCT Filed: Jun. 19, 2013

(86) PCT No.: PCT/JP2013/066808
§ 371 (c)(1),
(2) Date: Dec. 11, 2014

(87) PCT Pub. No.: WO2013/191201
PCT Pub. Date: Dec. 27, 2013

(65) Prior Publication Data
US 2015/0162187 A1    Jun. 11, 2015

(30) Foreign Application Priority Data
Jun. 19, 2012    (JP) .................................. 2012-137912

(51) Int. Cl.
*H01L 21/02* (2006.01)
*H01L 21/66* (2006.01)
(Continued)

(52) U.S. Cl.
CPC .......... *H01L 21/0262* (2013.01); *C30B 25/00* (2013.01); *C30B 25/186* (2013.01);
(Continued)

(58) Field of Classification Search
CPC ........... H01L 21/0262; H01L 21/02529; H01L 21/02433; H01L 21/02576;
(Continued)

(56) References Cited

U.S. PATENT DOCUMENTS

2012/0231615 A1* 9/2012 Shiomi ............. C23C 16/45504
438/503

FOREIGN PATENT DOCUMENTS

| JP | 2003-086518 A | 3/2003 |
| JP | 2003-173978 A | 6/2003 |

(Continued)

OTHER PUBLICATIONS

English Translation of Written Opinion of the International Searching Authority for PCT/JP2013/066808. Aug. 6, 2013. pp. 1-6.*

(Continued)

*Primary Examiner* — Hoang-Quan Ho
(74) *Attorney, Agent, or Firm* — Sughrue Mion, PLLC

(57) ABSTRACT

Provided is a method of manufacturing a SiC epitaxial wafer including a SiC epitaxial layer on a SiC substrate using a SiC-CVD furnace which is installed in a glove box. The method includes a SiC substrate placement step of placing the SiC substrate in the SiC-CVD furnace while circulating gas in the glove box.

7 Claims, 23 Drawing Sheets

(51) Int. Cl.
  *C30B 25/20* (2006.01)
  *C30B 29/36* (2006.01)
  *C30B 25/00* (2006.01)
  *C30B 25/18* (2006.01)
  *H01L 29/06* (2006.01)
  *H01L 29/16* (2006.01)

(52) U.S. Cl.
  CPC .............. *C30B 25/20* (2013.01); *C30B 29/36* (2013.01); *H01L 21/02529* (2013.01); *H01L 29/0692* (2013.01); *H01L 29/1608* (2013.01); H01L 21/02378 (2013.01); H01L 21/02433 (2013.01); H01L 21/02576 (2013.01); H01L 22/12 (2013.01)

(58) Field of Classification Search
  CPC ........... H01L 21/02378; H01L 29/1608; H01L 29/0692; H01L 22/12; C30B 25/186; C30B 25/00; C30B 25/20; C30B 29/36
  USPC .......................... 438/105, 931; 117/929, 951
  See application file for complete search history.

(56) References Cited

FOREIGN PATENT DOCUMENTS

| | | | |
|---|---|---|---|
| JP | 2003173978 A | * | 6/2003 |
| JP | 2004-507897 A | | 3/2004 |
| JP | 2008-103388 A | | 5/2008 |
| JP | 2009-164162 A | | 7/2009 |
| JP | 2009-181972 A | | 8/2009 |
| JP | 2009-256138 A | | 11/2009 |
| JP | 4581081 B2 | | 11/2010 |
| JP | 2011-121847 A | | 6/2011 |
| JP | 2012-028446 A | | 2/2012 |
| JP | 2012028446 A | * | 2/2012 |
| JP | 2012-051795 A | | 3/2012 |
| JP | 4959763 B2 | | 6/2012 |

OTHER PUBLICATIONS

R.A. Berechman, et al., "Electrical and structural Investigation of triangular defects in 4H—SiC junction barrier Schottky devices", Journal of Applied Physics, 2009, pp. 074513-074513-7, vol. 105.

Bernd Thomas et al., "Epitaxial Growth of n-Type 4H—SiC on 3" Wafers for Power Devices", Materials Science Forum, 2005, pp. 141-146, vols. 483-485.

James D. Oliver, et al., "A Designed Experiment Approach to Improvement and Understanding of the SiC Epitaxial Growth Process", Materials Science Forum, 2007, pp. 57-60, vols. 556-557.

International Search Report for PCT/JP2013/066808 dated Aug. 6, 2013.

Communication dated Mar. 15, 2016, from the Japanese Patent Office in counterpart application No. 2012-137912.

* cited by examiner (a)

(b)

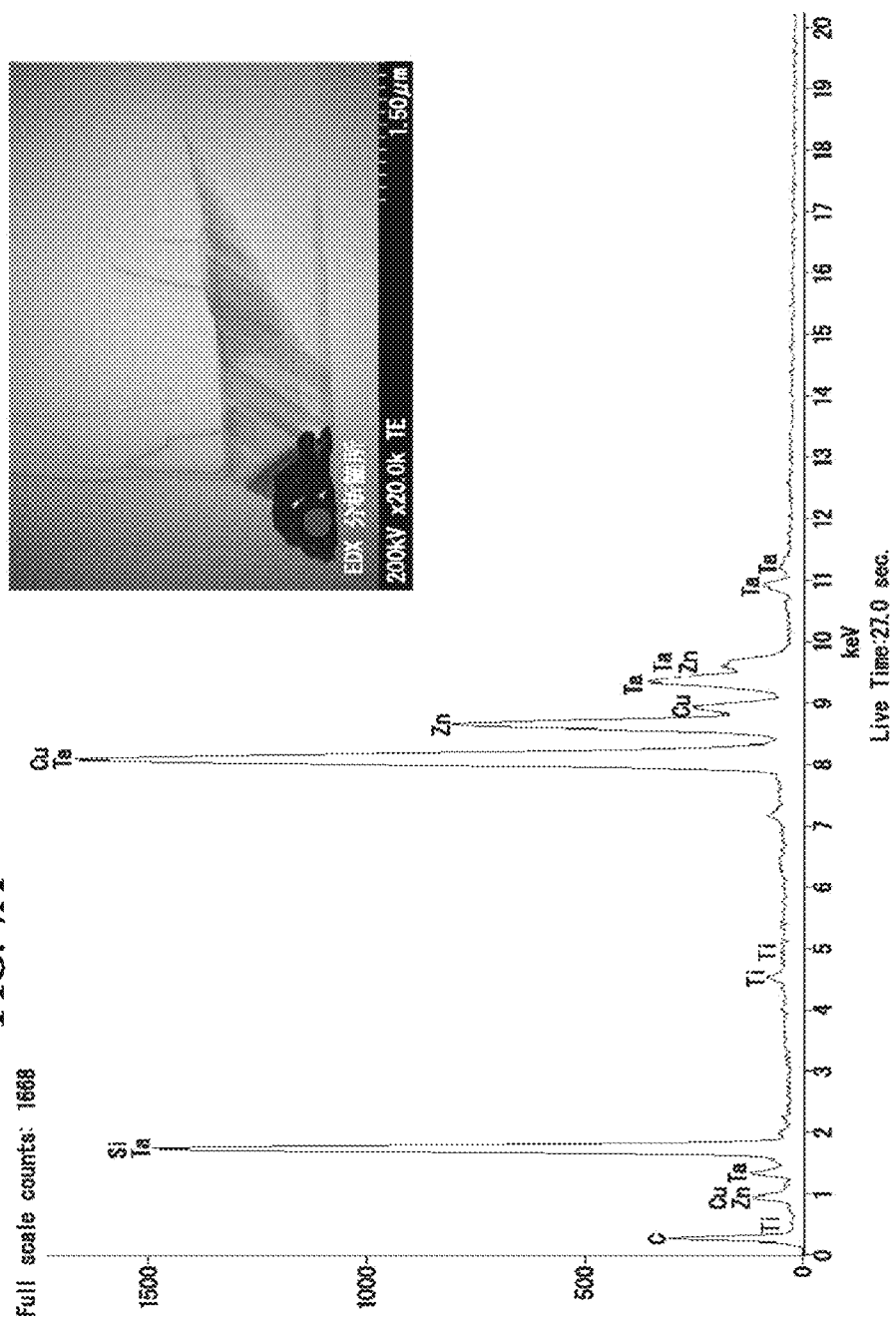

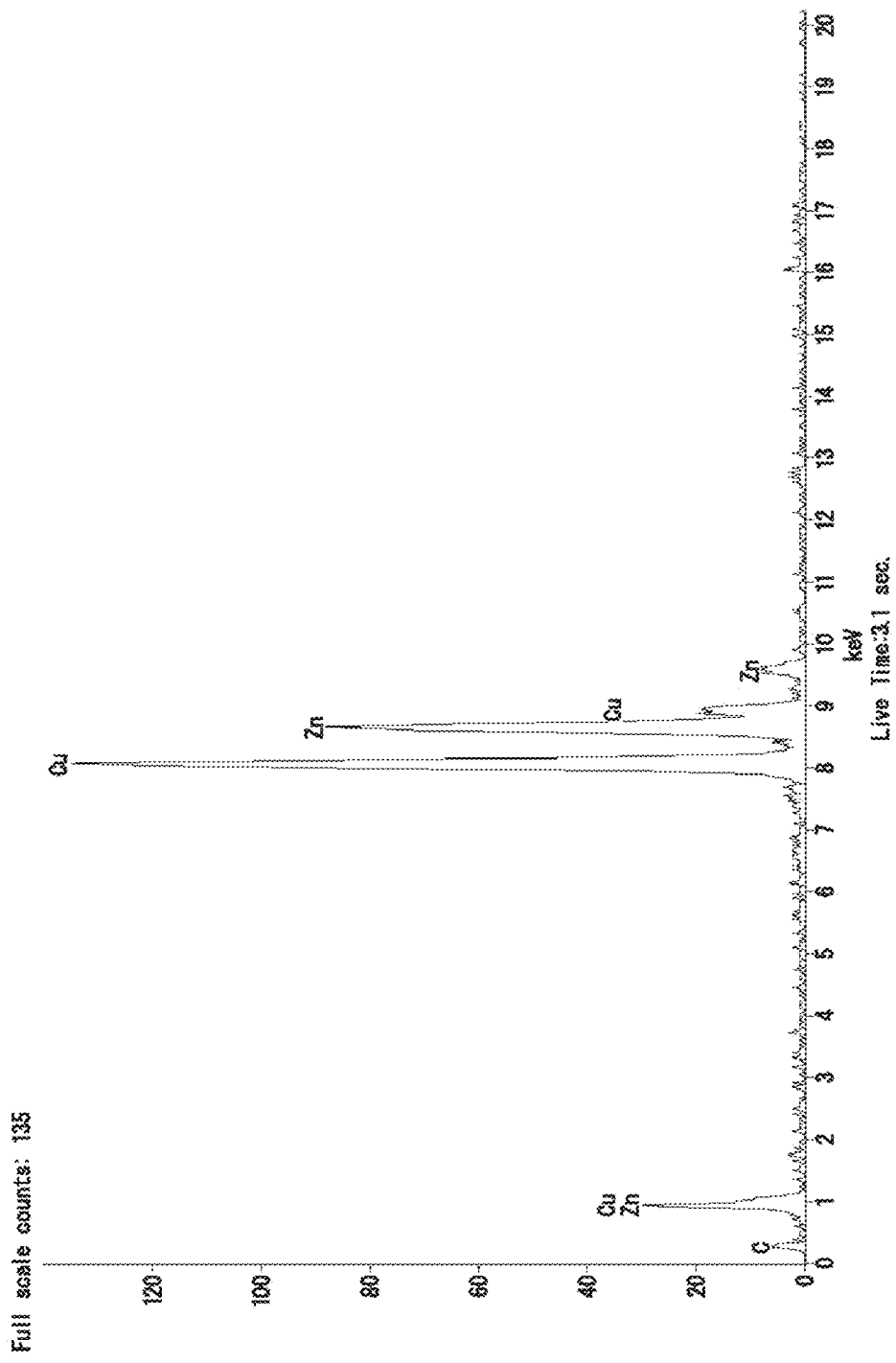

SIC EPITAXIAL WAFER AND METHOD FOR MANUFACTURING THE SAME

CROSS REFERENCE TO RELATED APPLICATIONS

This application is a National Stage of International Application No. PCT/JP2013/066808 filed Jun. 19, 2013, claiming priority based on Japanese Patent Application No. 2012-137912 filed Jun. 19, 2012, the contents of all of which are incorporated herein by reference in their entirety.

TECHNICAL FIELD

The present invention relates to a SiC epitaxial wafer and a method of manufacturing the same.

BACKGROUND ART

Silicon carbide (SiC) is characterized in that a breakdown electric field is one digit greater than that of silicon (Si), and a band gap and thermal conductivity are about three times more than those of Si. Therefore, silicon carbide (SiC) is expected to be applied to, for example, power devices, high-frequency devices, and high-temperature operation devices.

A SiC epitaxial wafer is manufactured by growing a SiC epitaxial film serving as an active region of a SiC semiconductor device on a SiC single crystal substrate, in general, using a chemical vapor deposition (CVD) method, in which the SiC single crystal substrate is processed from a SiC bulk single crystal produced by, for example, a sublimation method.

A defect with a triangular shape (hereinafter referred to as a "triangular defect") has been known as a defect in the SiC epitaxial film. The triangular defect is formed in a direction in which the apex of a triangle and an opposite side (base) are sequentially arranged in a line along a step-flow growth direction (NPL 3). That is, the opposite side (base) of the triangular defect is disposed in a direction perpendicular to the <11-20> direction. A plurality of origins of the triangular defect are considered. Examples of the origins include damage, such as a polishing flaw which remains on the surface of a substrate (wafer) (PTL 1), a 2-dimensional nucleus which is formed in a terrace during step-flow growth (PTL 2), a different polytype of crystal nucleus which is formed at the interface between the substrate and the epitaxial film in an oversaturated state at the early stage of growth (NPL 1), and a defect which has a minute broken piece of a SiC film, which will be described below, as a starting point. The triangular defect is grown as the SiC epitaxial film is grown. That is, the triangular defect is grown with step-flow growth such that its area increases while a shape which is substantially similar to a triangle and has the starting point as its apex is maintained (see the schematic diagram of FIG. 5). Therefore, in general, in as early stage of the growth of the SiC epitaxial film as the starting point of the defect occurs, the triangular defect grows large, and the depth of the starting point in the film can be estimated from the size of the triangular defect.

A reduction in the triangular defects is indispensable in order to improve yield in the mass production of the SiC epitaxial wafer. PTL 1 and PTL 2 disclose methods of reducing the triangular defects.

In addition, as a cause of deterioration in the quality of the SiC epitaxial film, there is a minute broken piece (hereinafter referred to as a "downfall") of a SiC film which falls on a SiC wafer, in a SiC epitaxial film, or on the SiC epitaxial film. The downfall is a piece of a SiC film which peels off from the SiC film deposited on a ceiling that is provided on the upper side of the chamber so as to face the upper surface of a susceptor including a wafer mounting portion on which a SiC wafer (SiC substrate) is placed. The downfall can be the starting point of the triangular defect.

Here, when the SiC epitaxial film is grown, it is necessary to heat the SiC wafer, which is a substrate, at a high temperature and to maintain the temperature. As a method of heating the substrate and maintaining the temperature, a method has been mainly used which performs heating using heating means that is located below the susceptor and/or above the ceiling (see PTL 3, NPL 2, and NPL 3). When the ceiling is heated, it is generally heated by high-frequency induction heating using an induction coil. The ceiling which is made of carbon suitable for the high-frequency induction heating is generally used.

While the SiC epitaxial film is formed, SiC is deposited not only on the SiC wafer but also on the ceiling or other members which are placed in a chamber (SiC-CVD furnace). When the film is repeatedly formed, the amount of SiC deposited on, for example, the ceiling, increases. Therefore, the problem of the downfall becomes notable particularly in mass production.

A reduction in the downfall is indispensable in order to improve yield in the mass production of the SiC epitaxial wafer.

However, in the SiC epitaxial wafer, nitrogen also becomes a dopant. Therefore, when the SiC epitaxial wafer is manufactured, a chamber (SiC-CVD furnace) 200 is arranged in a glove box 100, as shown in FIG. 23. Then, the glove box is filled with inert gas, such as argon gas. In general, a film forming process which forms a SiC epitaxial film on a SiC wafer while circulating the inert gas in the glove box through a filter 300 provided in the glove box (turning on circulation) is performed to manufacture the SiC epitaxial wafer. An arrow connecting two filters 300 schematically indicates the circulation of the inert gas.

As the filter which is provided in the glove box, for example, a filter is used which has the minimum removal ratio (particle collection ratio) with respect to particles with a size of 0.3 µm and has a particle removal ratio of 99.97% or more with respect to particles with a size of 0.3 µm.

Whenever a cover 201 of the chamber (SiC-CVD furnace) is opened in order to place the SiC substrate or to withdraw the manufactured SiC epitaxial wafer, a deposit (particle), such as SiC, which is attached to the members which are placed in the chamber is scattered in the glove box and contaminates the inside of the glove box. The main purpose of the circulation of the inert gas in the glove box through the filter is to remove the deposit.

In FIG. 23, a dotted line above the cover which is represented by reference numeral 201 indicates a state in which the cover is opened and a vertical arrow indicates that the cover can be opened and closed.

CITATION LIST

Patent Literature

[PTL 1]: Japanese Patent No. 4581081
[PTL 2]: Japanese Unexamined Patent Application, First Publication No. 2009-256138
[PTL 3]: Published Japanese Translation No. 2004-507897 of the PCT International Publication

[PTL 4]: Japanese Unexamined Patent Application, First Publication No. 2009-164162

[PTL 5]: Japanese Patent No. 4959763

Non-Patent Literature

[NPL 1]: Journal of Applied Physics 105 (2009) 074513

[NPL 2]: Materials Science Forum Vols. 483-485 (2005) pp. 141-146

[NPL 3]: Materials Science Forum Vols. 556-557 (2007) pp. 57-60

SUMMARY OF INVENTION

Problems to be Solved by the Invention

Here, when the SiC epitaxial wafer is manufactured, first, a substrate placement operation of placing the SiC wafer (SiC (single crystal) substrate) in the chamber needs to be performed. In the related art, the substrate placement operation (that is, the operation which is performed while the cover of the chamber is opened) is performed with the circulation turned off. The reason why the substrate placement operation is performed, with the circulation turned off, is as follows. When the circulation is turned on, the amount of movement of gas in the glove box is large and a deposit, such as a SiC deposit attached to the inner wall of the chamber or members which are placed in the chamber, is scattered. The scattered deposit is attached to the SiC wafer (SiC substrate) during the placement operation.

Particles including the SiC deposit and other deposits are attached to the SiC wafer (SiC substrate) in various stages. For example, the following situations are considered: particles are attached when the cover of the chamber (SiC-CVD furnace) is closed; particles are attached when a raw material gas is introduced; and particles are attached when a temperature increases for an epitaxial growth. These correspond to cases in which particles are attached in the chamber (SiC-CVD furnace). It is not easy to solve the problem that particles are attached in the chamber. In addition, problems related to an environment in the glove box, which is an environment outside the chamber, have not been examined well. For example, the following have not been examined: the relationship between the number of floating particles and defects of the SiC epitaxial wafer caused by the particles; and methods of reducing the defects. When the particles in the glove box are also attached onto the SiC substrate, they cause triangular defects.

However, it is difficult to sufficiently reduce the density of triangular defects other than the triangular defects caused by the existing particles in the glove box, using the methods disclosed in PTL 1 and PTL 2. One of the reasons is the presence of other triangular defects, the cause of which has not been well known.

Regarding the downfall, the downfall can be prevented from falling from the ceiling on the SiC substrate or the SiC epitaxial film grown on the SiC substrate, by using the method disclosed in PTL 4. However, it is difficult to suppress the deposition of SiC (or the growth of a SiC film) on the ceiling which causes the downfall. For this reason, it is necessary to clean the ceiling. However, when cleaning is performed, there is a problem that the operation rate of the apparatus is reduced. In addition, SiC is deposited on the lower surface of a cover plate. Therefore, when the film is repeatedly formed, there is a problem that the downfall falls from the cover plate.

The invention has been made in view of the above-mentioned problems and an object of the invention is to provide a SiC epitaxial wafer with a low surface density of triangular defects which include particles attached to a SiC substrate as starting points and a method of manufacturing the same. Another object of the invention is to provide a SiC epitaxial wafer with a low surface density of triangular defects which include a piece of a member placed in a chamber as a starting point and a method of manufacturing the same.

Means for Solving the Problem

The inventors made a thorough study on the relationship between the on or off state of circulation, and the number of existing particles by size in the glove box and the total number of the existing particles and the relationship between the on or off state of circulation and the surface density of triangular defects formed in the epitaxial film of the SiC epitaxial wafer. The inventors obtained the results which overturned common sense. That is, the inventors found that, when a SiC wafer (SiC substrate) substrate placement operation was performed with circulation maintained in an on state rather than in an off state, the surface density of triangular defects caused by the existing particles in the glove box was low.

The inventors found a triangular defect having a piece of a member which is placed in a chamber (SiC-CVD furnace) as a starting point. That is, the inventors found that the piece of the member which is placed in the chamber fell on a SiC substrate or a SiC epitaxial film during growth due to a certain cause and a new type of triangular defect was grown from the piece as a starting point. In the related art, as described above, for example, a polishing flaw which remains on the surface of the substrate (wafer) or a different polytype of crystal nucleus which is generated on a step have been known as the starting point of the triangular defect. However, the currently found triangular defect has the piece of the member which is placed in the chamber as the starting point.

Here, the triangular defect which is caused by existing particles in the glove box includes, as the starting point, a particle which is attached onto the SiC substrate when the SiC substrate is placed in the SiC-CVD furnace before epitaxial growth. The distance of the triangular defect from the starting point to the opposite side (base) in the horizontal direction (distance in a plan view) is determined by the off angle of the SiC substrate and the thickness of the epitaxial layer. Therefore, it is possible to determine whether the triangular defect is likely to be caused by the existing particles in the glove box on the basis of the distance of the triangular defect from the starting point to the opposite side in the horizontal direction (distance in a plan view).

The triangular defect including the piece of the member which is placed in the chamber as the starting point is characterized in that the starting point is unclear in an optical microscope image or an image (hereinafter, referred to as a candela image) obtained by an optical surface inspection apparatus using a laser beam, which will be described below. The characteristics show that the triangular defect is likely to be caused by the piece of the member which is placed in the chamber.

(Particles in Glove Box)

FIG. 1 is a graph showing the relationship between the number of particles in the glove box which is measured by a particle counter before a SiC substrate is placed in the SiC-CVD furnace and the surface density of triangular defects which is measured from a SiC epitaxial layer (a thickness of 12.5 μm) of a SiC epitaxial wafer after the SiC epitaxial wafer having the SiC epitaxial layer on the SiC substrate is manufactured. The horizontal axis indicates the number of existing particles in the glove box and the vertical axis indicates the measured surface density (pieces/cm$^2$) of the triangular defects. The number of particles in the glove box is the number of particles in 28.8 liters (1 ft$^3$ (cubic feet)) of gas.

Hot Wall SiC CVD (VP2400HW) manufactured by Aixtron Corporation was used as the glove box and the SiC-CVD furnace (hereinafter, the results of the invention were obtained using the same). The gas which was circulated was argon and the filter was a HEPA filter. The removal ratio (particle collection ratio) of the filter varies depending on a particle size. The filter used had a minimum removal ratio (particle collection ratio) with particles with a size of 0.3 μm and had a particle removal ratio of 99.97% or more with respect to particles with a size of about 0.3 μm (hereinafter, the results of the invention were obtained using the same). Aero Track 9110 manufactured by Nitta Corporation was used as the particle counter (hereinafter, the results of the invention were obtained using the same).

As shown in FIG. 1, as the number of existing particles in the glove box increases, the surface density of the triangular defects in the SiC epitaxial layer increases monotonously.

Here, the measured triangular defects include triangular defects caused by the particles in the glove box and triangular defects caused by particles other than the particles in the glove box (mainly a deposit which is attached to a member which is placed in the SiC-CVD furnace or a piece which peels off from the member (a piece of the member)). In FIG. 1, the triangular defects, which are present even though the number of particles is close to zero, are caused by particles other than the existing particles in the glove box.

FIG. 2 is a graph showing the measurement result of the number of particles in the glove box when the circulation (gas circulation) is alternatively and repeatedly turned on and off. In the graph, the horizontal axis indicates time (minute), the vertical axis indicates the number of particles in 28.8 liters of gas, and vertical dashed lines indicate the switching between the on and off states of circulation. In addition, in FIG. 2, "*" indicates that a simulated operation (corresponding to the SiC substrate placement operation) is performed by hands in the glove box at that time.

As can be seen from FIG. 2, when the circulation is turned on, the number of particles in the glove box is significantly less than that when the circulation is turned off. In addition, when the circulation is switched from the off state to the on state, the number of particles in the glove box is reduced to the minimum value within a few minutes and the effect of the circulation is sufficient.

When the circulation is turned off, the number of particles in the glove box increases. It is considered that this is because the particles in the glove box are scattered due to the backward flow of the particles from the filter or a disturbance in the flow of gas and are not removed by the filter since the circulation is in the off state.

As can be seen from this result, even when the circulation is turned on to clean the inside of the glove box and is then turned off, the glove box is contaminated.

FIG. 3 is a graph showing the relationship between the number of particles in the glove box, and the opening and closing of the cover of the SiC-CVD furnace (chamber) accompanied by the SiC substrate placement operation and the on or off state of the circulation (gas circulation).

In FIG. 3, "♦" (Example) indicates an example in which the circulation is turned on through the opening and closing of the cover of the SiC-CVD furnace (chamber) accompanied by the SiC substrate placement operation. In addition, "Δ" (Comparative Example 1) and "□" (Comparative Example 2) indicate examples in which, when the cover of the SiC-CVD furnace (chamber) is opened, the circulation is changed from an on state to an off state, the SiC substrate is placed, the cover is closed, and the circulation is turned on. In the graph, the horizontal axis indicates time (minute) and the vertical axis indicates the number of particles in 28.8 liters of gas. In FIG. 3, a vertical line represented by "charge start" indicates the time when the cover is opened in order to place the SiC substrate. In addition, in each example, a vertical line after the vertical line represented by "charge start" indicates the time when the placement of the SiC substrate is completed and the cover is closed. In each example, a circle after the vertical line indicates the number of particles immediately before the formation of the epitaxial film starts.

As shown in FIG. 3, when the circulation is maintained in the on state ("♦"), there is little increase in the number of particles in the glove box even though the cover of the SiC-CVD furnace (chamber) is opened and the SiC substrate placement operation is performed.

In contrast, in the examples ("Δ" and "□") in which the circulation is changed from the on state to the off state, the cover of the SiC-CVD furnace (chamber) is opened, and the SiC substrate placement operation is performed, the number of particles in the glove box increases.

It is considered that the increase in the number of particles is caused by the backward flow of the particles from the filter and the scattering of the particles in the SiC-CVD furnace (chamber).

Table 1 shows the measurement results of the surface density (pieces/cm$^2$) of all triangular defects in the epitaxial layer of the SiC epitaxial wafer, the surface density (pieces/cm$^2$) of triangular defects with a width (a distance from the starting point to the opposite side of a triangle in the horizontal direction (the distance in a plan view) (see FIG. 5)) of about 180 μm (that is equal to or greater than 162 μm and equal to or less than 198 μm), and the surface density (pieces/cm$^2$) of triangular defects with a starting point size (a size in a direction in which the size is the maximum in a plan view) of less than 20 μm among the triangular defects with a width (the distance from the starting point to the opposite side of the triangle in the horizontal direction) of about 180 μm (that is equal to or greater than 162 μm and equal to or less than 198 μm) from the left column when the circulation (gas circulation) is turned on and off. Here, the above-mentioned surface density of the triangular defects was measured by an optical microscope (MX51 manufactured by Olympus Corporation). The term "all triangular defects" means all of the triangular defects with an unlimited width (the distance from the starting point to the opposite side of the triangle in the horizontal direction).

The reason why the triangular defects with a starting point size (a size in a direction in which the size is the maximum in a plan view) of less than 20 μm are separately measured is as follows. It is considered that the particles attached onto the SiC substrate include particles floating in the glove box and particles of a piece of a member which is placed in the chamber (for example, a ceiling) which falls before epitaxial growth. Empirically, the latter particle has a large particle size and the size of the starting point of the defect caused by the large particle size is large. In contrast, the former particle generally has a smaller particle size than the latter particle.

When the former particle and the latter particle are classified according to the size of the starting point, 20 µm is the standard of the classification. The measured SiC epitaxial wafer was the first SiC epitaxial wafer after the furnace was cleaned and the formation conditions of the epitaxial layer were the same as those in the Example except for the thickness (12.5 µm). The SiC substrate was a 4H—SiC single crystal with an off angle of 4° and the thickness of the epitaxial layer was 12.5 µm. The width of the triangular defect which is formed from the particle attached to the SiC substrate before epitaxial growth as the starting point is 180 µm (=12.5/tan 4°) (see FIG. 5).

TABLE 1

| | Defect density/cm$^2$ | | |
|---|---|---|---|
| | All triangular defects | Triangular defects with a width of about 180 µm | Triangular defects with a starting point size of less than 20 µm |
| OFF | 1.0 | 0.33 | 0.07 |
| ON | 1.0 | 0.27 | 0 |

As shown in Table 1, when the circulation was maintained in the on state, both the surface density of the triangular defects with a width of about 180 µm and the surface density of the triangular defects with a starting point size of less than 20 µm among the triangular defects with a width of about 180 µm were less than those the circulation was turned off. The reason can be considered as follows. The circulation was maintained in the on state through the opening and closing of the cover of the SiC-CVD furnace. As a result, it was possible to perform the SiC substrate placement operation at low particle density in the glove box. Therefore, the number of particles attached onto the SiC substrate in the glove box before epitaxial growth was reduced.

In particular, the surface density of the triangular defects with a starting point size of less than 20 µm among the triangular defects with a width of about 180 µm was zero. It is considered that the continuous circulation through the opening and closing of the cover of the SiC-CVD furnace is particularly effective in the removal of particles with a small size in the glove box.

(Triangular Defect Having Piece of Member which is Placed in Chamber as Starting Point)

FIG. 4(a) shows an optical microscope image of a triangular defect having a piece of a member which is placed in a typical chamber as a starting point. MX51 manufactured by Olympus Corporation was used as the optical microscope.

The SiC epitaxial wafer shown in FIG. 4(a) was produced by Hot Wall SiC CVD (VP2400HW) manufactured by Aixtron Corporation, which was a multi-wafer susceptor-type (rotation/revolution) SiC-CVD furnace for mass production. A shielding plate was not used and a ceiling made of graphite was used. The SiC epitaxial wafer in which a SiC epitaxial film with a thickness of 10 µm is formed on a 4H—SiC single crystal substrate with an off-angle of 4° is of an eightieth production lot (that is, after a film corresponding to total SiC epitaxial film thickness of 800 µm is formed in the chamber).

When the SiC epitaxial wafer is observed by the optical microscope, generally, the optical microscope is focused on the surface of the epitaxial film and a defect on the surface is observed. FIG. 4(b) shows an optical microscope image of the same triangular defect when the optical microscope is focused on the surface of the epitaxial film and the defect on the surface is observed.

In contrast, the inventors shifted the optical microscope focused on the surface, focused the optical microscope on the interface between the SiC single crystal substrate and the epitaxial film, and found a black foreign material (a black point ("a starting point of a triangular defect")) shown at the center of a circle) in front (a direction distant from the opposite side) of the apex of the triangular defect. Then, the inventors thoroughly analyzed the foreign material, identified the origin (the piece of the member which is placed in the chamber) of the foreign material, and found a new type of triangular defect having the piece of the member which is placed in the chamber as the starting point which had not been known before.

FIG. 5 shows a transmission electron microscope (TEM) image obtained from the same SiC epitaxial wafer. HF-2200 manufactured by Hitachi High-technologies Corporation was used as a transmission electron microscope.

The figure shown on the right side of the TEM image in FIG. 5 schematically shows the starting point of the triangular defect and the triangular defect grown from the starting point. A portion which is surrounded by a rectangle indicates a range shown on the TEM image and the TEM image is an observed image in the vicinity of the starting point of the triangular defect. The figure shown on the lower side of FIG. 5 schematically shows the cross-section in the vicinity of the triangular defect.

In the case of the triangular defect, the foreign material which is the starting point of the triangular defect is about 7 µm ahead of the apex of the triangle in the horizontal direction and the distance from the starting point to the opposite side of the triangle in the horizontal direction is about 143 µm.

FIG. 6 shows a transmission electron microscope (TEM) image in the vicinity of the starting point (foreign material) of a triangular defect in a SiC epitaxial wafer which is manufactured under the same conditions as the above-mentioned SiC epitaxial wafer except that a shielding plate made of a graphite base coated with a tantalum carbide (TaC) film is used below the ceiling.

A portion of the triangular defect having the foreign material as the starting point is made of a 3C—SiC single crystal and a portion which is epitaxially grown normally in the vicinity of the triangular defect is made of a 4H—SiC single crystal.

FIG. 7A shows the analysis result of the composition of the foreign material, which is the starting point of the triangular defect shown in FIG. 6, by energy dispersive X-ray spectroscopy (EDX).

In FIG. 7A, a peak of 1.711 keV and a peak of 8.150 keV indicate tantalum (Ta). Only the shielding plate is a member made of a material containing tantalum (Ta), which is placed in the chamber. Therefore, it can be determined that the peaks of tantalum result from tantalum (Ta) of tantalum carbide (TaC) which is the material coating the shielding plate.

FIG. 7B shows the EDX analysis result of a sample holder by the EDX.

The peaks of Zn, Cu, and the like shown in FIG. 7A result from the material of the EDX holder.

As described above, the inventors found a new type of triangular defect having, as the starting point, the foreign material (material piece) which was the material forming the member (the shielding plate in FIG. 6) which is placed in the chamber and was disposed ahead of the apex of the triangular defect (in a direction distant from the opposite side).

When the triangular defects are observed by an optical microscope or an optical surface inspection apparatus (for example, Candela manufactured by KLA-Tencor Corporation) using a laser beam, triangular defects with a clear starting point and triangular defects with an unclear starting point are observed. In the related art, in many cases, it has been analyzed that the triangular defects with the unclear starting point are caused by the following: since the growth conditions are not satisfied (for example, the growth temperature is too low), it is difficult to normally perform step-flow growth and a different polytype of crystal nucleus becomes the starting point of the triangular defect. In contrast, the inventors found that some of the triangular defects with the unclear starting point were caused by the pieces of the member which is placed in the chamber. At the present time, it may not be determined that all of the triangular defects with the unclear starting point are caused by the pieces of the member which is placed in the chamber. However, the inventors conceived a technique for reducing the triangular defects caused by the pieces of the member which is placed in the chamber and succeeded in removing almost all of the triangular defects with the unclear starting point, which will be described below. Therefore, it is considered that most of the triangular defects with the unclear starting point are caused by the pieces of the member which is placed in the chamber.

It is possible to determine whether the triangular defect with the unclear starting point is a triangular defect including the pieces of the member which is placed in the chamber as the starting point using, for example, a method of shifting the focus of the optical microscope from the surface in a depth direction, as described above. Therefore, it is possible to obtain the surface density of the triangular defects having the pieces of the member which is placed in the chamber as the starting point.

Deterioration of the member which is placed in the chamber progresses as films are repeatedly formed (the number of production lots increases) and thus the number of falling pieces of the member which is placed in the chamber increases. Therefore, the surface density of the triangular defects having the pieces of the member which is placed in the chamber as the starting point increases as the number of times the film is formed increases. Here, the deterioration of the member which is placed in the chamber means the following. An example of the deterioration is the peeling-off of a film. That is, in the case of the ceiling in which a graphite base is coated with a tantalum carbide (TaC) film, since the tantalum carbide film and the graphite base have different thermal expansion coefficients, stress is applied to the tantalum carbide film due to a temperature variation caused by the repetition of the formation of a film and the tantalum carbide film peels off. As other examples of the deterioration, the tantalum carbide film is cracked and dust of the graphite base is generated from the crack and the material forming the ceiling is sublimated by the mutual interaction between gas in the chamber and the surface of the ceiling. In addition, when SiC is deposited on the ceiling and a SiC film is grown thereon, the tantalum carbide film deteriorates due to a difference in the thermal expansion coefficient between the SiC film and the tantalum carbide film. As such, the surface density of the triangular defects having the member which is placed in the chamber as the starting point highly depends on the number of times the film is formed (or the number of production lots). In addition, when the number of times the film is formed is greater than a predetermined value (depending on manufacturing conditions), the deterioration of the member which is placed in the chamber progresses and the surface density of the triangular defects having the member which is placed in the chamber as the starting point increases rapidly.

In contrast, a triangular defect which has damage, such as a polishing flaw in the surface of the substrate (wafer), as a starting point or a triangular defect which has a different polytype of crystal nucleus formed due to unsuitable growth conditions as a starting point does not depend on the number of times the film is formed. That is, a triangular defect caused by the substrate or a triangular defect caused by the growth conditions does not depend on the number of times the film is formed.

A triangular defect having a downfall as a starting point also depends on the number of times the film is formed. The downfall falls from the ceiling when the shielding plate is not used. The downfall falls from the shielding plate when the shielding plate is used. When the film is repeatedly formed, the SiC film formed on the ceiling or the shielding plate is thick and is likely to peel off. When the shielding plate is used, at least the lower surface of the shielding plate is preferably made of a material which has higher adhesion to the SiC film than the ceiling, which will be described below. Therefore, it is possible to reduce the downfall, as compared to the case in which the shielding plate is not used.

It is considered that the triangular defects caused by the particles in the glove box also depend a little on the number of times the film is formed since the contamination of the chamber is spread to the glove box when the substrate is carried in or out of the chamber.

Accordingly, examples of the triangular defects which increase with the repetition of the formation of the film include a triangular defect having the downfall as the starting point and a triangular defect caused by a particle in the glove box (as the starting point), in addition to the triangular defect having the piece of the member which is placed in the chamber as the starting point. However, the triangular defect having the piece of the member which is placed in the chamber as the starting point is characterized in that the starting point is unclear in an optical microscope image or an image (hereinafter, referred to as a "candela image") obtained by an optical surface inspection apparatus using a laser beam. In contrast, in the triangular defect having the downfall as the starting point, in many cases, the starting point is clear. Therefore, in general, it is possible to identify the triangular defect from, for example, the optical microscope image or the candela image. Even when triangular defects which are caused by factors other than the downfall are included in the triangular defects with the unclear starting point, the surface density of the triangular defects can be considered to be the upper limit of the surface density of the triangular defects having the piece of the member which is placed in the chamber as the starting point. Therefore, the surface density of the triangular defects with the unclear starting point can be managed to manage the upper limit of the surface density of the triangular defects having the piece of the member which is placed in the chamber as the starting point. An increase in the surface density of the triangular defects with the unclear starting point due to the repetition of the formation of the film can be managed to manufacture a SiC epitaxial wafer with a low surface density of the triangular defects having the piece of the member which is placed in the chamber as the starting point.

The composition of a foreign material in front of the triangular defect can be analyzed by, for example, energy dispersive X-ray spectroscopy to strictly measure and manage the density of the triangular defects having the piece of the member which is placed in the chamber as the starting point.

At the present time, it is unclear whether the triangular defect caused by the particle in the glove box is included in the triangular defects with the unclear starting point. When the triangular defect caused by the particle in the glove box is included in the triangular defects with the unclear starting point, the percentage of the triangular defects caused by the particle in the glove box in the triangular defects with the unclear starting point (whether the triangular defects depend on the manufacturing conditions) is unclear. However, when a substrate placement process is performed with the particle density reduced in the glove box by the method according to the invention, it is possible to reduce the density of the triangular defects caused by the particles in the glove box. As a result, it is possible to increase the measurement accuracy of the surface density of the triangular defects having the piece of the member which is placed in the chamber as the starting point. In addition, it is preferable to apply a method of reducing the surface density of the triangular defects having the piece of the member which is placed in the chamber as the starting point after particle density in the glove box is reduced by the method according to the invention.

When the member which is placed in the chamber deteriorates due to the repetition of the formation of the film, a minute lump peels off from the surface of the member which is placed and falls on the wafer or the SiC epitaxial film which is being grown on the wafer. The piece of the member which is placed in the chamber which is the starting point of the triangular defect is considered as the minute lump. The member which is placed in the chamber which causes the piece serving as the starting point of the triangular defect is mainly a member located above the wafer. It is presumed that the number of pieces which fall on the wafer from the wall surfaces of the chamber or other members which is placed in the chamber is negligible.

Accordingly, in order to reduce the triangular defects having the piece of the member which is placed in the chamber as the starting point, the inventors conceived a technique in which members, which are located above a wafer, are coated with a material which generates a small amount of dust or has low sublimation, so as to face the wafer, the surface density of the triangular defects having a piece of a member which is placed in a chamber as a starting point is measured regularly (for example, for each production lot or for every plurality of production lots) or irregularly, and the value of the surface density is managed. In the technique, when the surface density was greater than a predetermined value, the member was replaced and the next SiC epitaxial wafer was manufactured. In this way, it was possible to manufacture a SiC epitaxial wafer with a low surface density of the triangular defects having the piece of the member which is placed in the chamber as the starting point.

The invention provides the following means in order to solve the above-mentioned problems.

(1) There is provided a method of manufacturing a SiC epitaxial wafer including a SiC epitaxial layer on a SiC substrate using a SiC-CVD furnace which is installed in a glove box. The method includes a SiC substrate placement step of placing the SiC substrate in the SiC-CVD furnace while circulating gas in the glove box.

(2) In the method of manufacturing a SiC epitaxial wafer according to (1), the gas may be circulated before and after the SiC substrate is placed in the SiC-CVD furnace.

(3) In the method of manufacturing a SiC epitaxial wafer according to (2), the gas may be circulated at least 3 minutes before the SiC substrate is placed in the SiC-CVD furnace.

(4) In the method of manufacturing a SiC epitaxial wafer according to any one of (1) to (3), the SiC substrate placement step may be performed after it is checked that particle number density in the glove box is equal to or less than a predetermined value.

(5) In the method of manufacturing a SiC epitaxial wafer according to any one of (1) to (4), the SiC-CVD furnace may include a susceptor that has a wafer mounting portion on which a wafer is placed, a ceiling that faces an upper surface of the susceptor such that a reaction space is formed between the ceiling and the susceptor, and a shielding plate that is provided so close to a lower surface of the ceiling that a deposit is prevented from being attached to the lower surface of the ceiling. A surface of the shielding plate which faces the susceptor may be coated with a silicon carbide film or a pyrolytic carbon film or the shielding plate may be made of silicon carbide. The method may further include a step of measuring the surface density of triangular defects including a piece of a member which is placed in the SiC-CVD furnace as a starting point in a SiC epitaxial film (layer) of a previously manufactured SiC epitaxial wafer and manufacturing the next SiC epitaxial wafer.

(6) In the method of manufacturing a SiC epitaxial wafer according to (5), when the measurement result shows that the surface density of the triangular defects including a piece of a member which is placed in the SiC-CVD furnace as the starting point is greater than a predetermined value, the shielding plate may be replaced and the next SiC epitaxial wafer may be manufactured.

(7) In the method of manufacturing a SiC epitaxial wafer according to any one of (1) to (4), the SiC-CVD furnace may include a susceptor that has a wafer mounting portion on which a wafer is placed and a ceiling that faces an upper surface of the susceptor such that a reaction space is formed between the ceiling and the susceptor. A surface of the ceiling which faces the susceptor may be coated with one of a silicon carbide film and a pyrolytic carbon film, or the ceiling may be made of silicon carbide. The method may further include a step of measuring the surface density of triangular defects including a piece of a member which is placed in the SiC-CVD furnace as a starting point in a SiC epitaxial film (layer) of a previously manufactured SiC epitaxial wafer and manufacturing the next SiC epitaxial wafer.

(8) In the method of manufacturing a SiC epitaxial wafer according to (7), when the measurement result shows that the surface density of the triangular defects including a piece of a member which is placed in the SiC-CVD furnace as the starting point is greater than a predetermined value, the ceiling may be replaced and the next SiC epitaxial wafer may be manufactured.

(9) There is provided a SiC epitaxial wafer including a SiC epitaxial layer that is formed on a SiC substrate having an off angle. The surface density of triangular defects, in which a distance from a starting point to an opposite side in a horizontal direction is equal to or greater than (a thickness of the SiC epitaxial layer/tan(x))×90% and equal to or less than (the thickness of the SiC epitaxial layer/tan(x))×110%, in the SiC epitaxial layer is in the range of 0.05 pieces/cm$^2$ to 0.5 pieces/cm$^2$ (where x indicates the off angle).

(10) In the SiC epitaxial wafer according to (9), the surface density of triangular defects with a starting point size of less than 20 μm may be equal to or less than 0.05 pieces/cm$^2$.

(11) In the SiC epitaxial wafer according to (9) or (10), the surface density of triangular defects including a piece of a member which is placed in a SiC-CVD furnace as a starting point in the SiC epitaxial layer may be equal to or less than 0.5 pieces/cm$^2$.

(12) In the SiC epitaxial wafer according to claim 10, the piece of the member as the starting point may be made of one of carbon and silicon carbide.

(13) There is provided a method of manufacturing a SiC epitaxial wafer including a SiC epitaxial layer on a SiC substrate using a SiC-CVD furnace which is installed in a glove box. The method includes a particle number density check step of measuring particle number density in the glove box and checking whether the particle number density is equal to or less than a predetermined value before the SiC substrate is placed in the SiC-CVD furnace.

Here, the term "SiC-CVD furnace installed in the glove box" means a type in which a furnace portion for performing epitaxial growth in the SiC-CVD furnace is surrounded by the glove box and the environment of the SiC-CVD furnace is connected the internal environment of the glove box immediately after the cover of the SiC-CVD furnace (chamber) is opened in order to place the SiC substrate and does not include a constitution in which the glove box and the SiC-CVD furnace are separated by a gate.

The term "when the SiC substrate is placed in the SiC-CVD furnace" means that the cover of the SiC-CVD furnace (chamber) is opened, the inside of the SiC-CVD furnace is exposed, and the SiC substrate is placed in the SiC-CVD furnace.

The term "before and after the SiC substrate is placed in the SiC-CVD furnace" means that the cover of the SiC-CVD furnace (chamber) is opened and closed in order to place the SiC substrate therein.

The term "starting point size" means the size of the starting point in a direction in which the size is the maximum in a plan view.

In the sentence "distance from a starting point to an opposite side in a horizontal direction is equal to or greater than (a thickness of the SiC epitaxial layer/tan(x))×90% and equal to or less than (the thickness of the SiC epitaxial layer/tan(x))×110%", "90%" and "110%" are set considering a variation in the film formation conditions.

Effects of the Invention

According to the invention, it is possible to provide a SiC epitaxial wafer with a low surface density of triangular defects having a particle attached onto a SiC substrate as a starting point and a method of manufacturing the same.

According to the invention, it is possible to provide a SiC epitaxial wafer with a low surface density of triangular defects having a piece of a member which is placed in a chamber as a starting point and a method of manufacturing the same.

BRIEF DESCRIPTION OF DRAWINGS

FIG. 4(*a*) shows the optical microscope image when an optical microscope is focused on a foreign material and FIG. 4(*b*) shows the optical microscope image when the optical microscope is focused on the surface of an epitaxial film.

FIG. 7A shows the measurement result of the same SiC epitaxial wafer as that shown in FIG. 6 by energy dispersive X-ray spectroscopy and shows the measurement result of a foreign material.

FIG. 7B shows the measurement result of the same SiC epitaxial wafer as that shown in FIG. 6 by energy dispersive X-ray spectroscopy and shows the measurement result of a sample holder.

DESCRIPTION OF EMBODIMENTS

Figure 1:
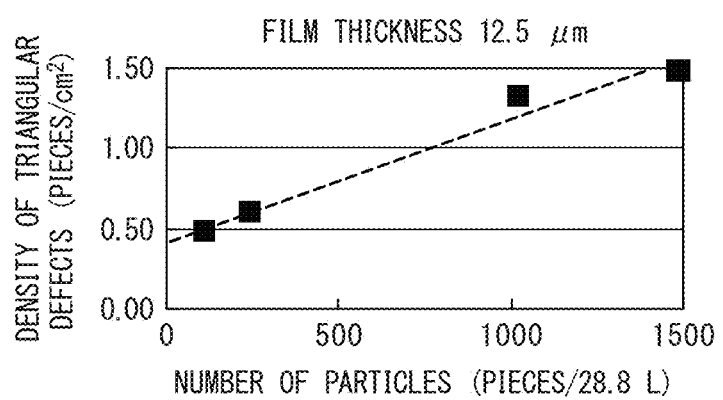
FIG. 1 is a graph showing the relationship between the number of particles in a glove box and the surface density of triangular defects which is measured in a SiC epitaxial layer of an epitaxial wafer.
Figure 2:
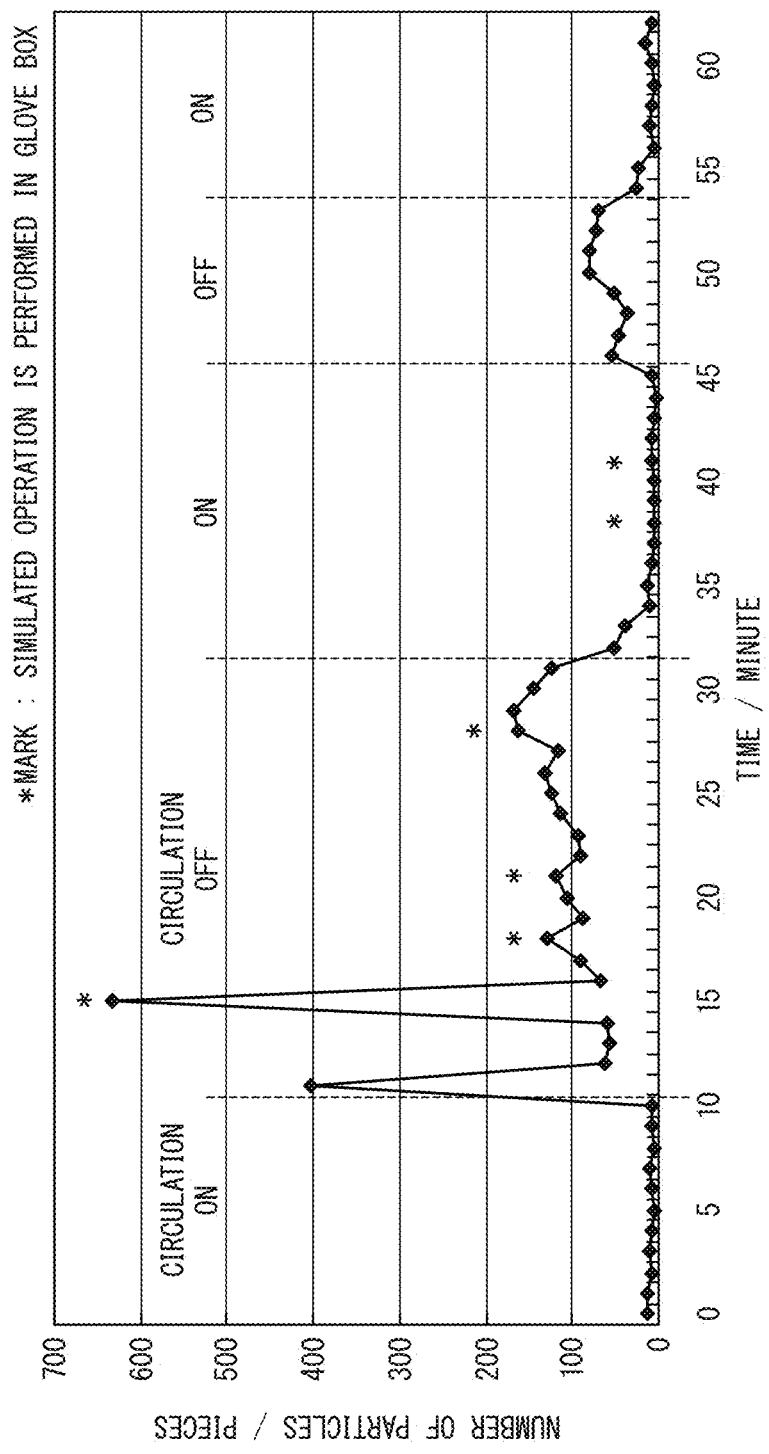
FIG. 2 is a graph showing the investigation result of a change in the number of particles in the glove box when the circulation (gas circulation) is alternatively and repeatedly turned on and off.
Figure 3:
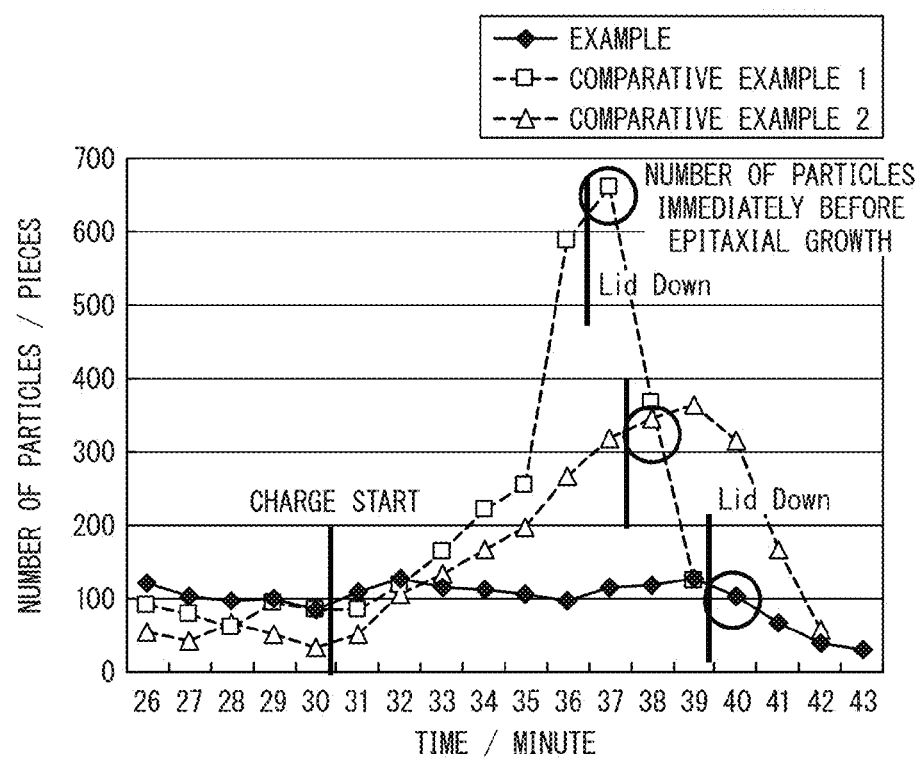
FIG. 3 is a graph showing the relationship between the number of particles in the glove box, and the opening and closing of a cover of a SiC-CVD furnace and the turning on and off of circulation.
Figure 4:
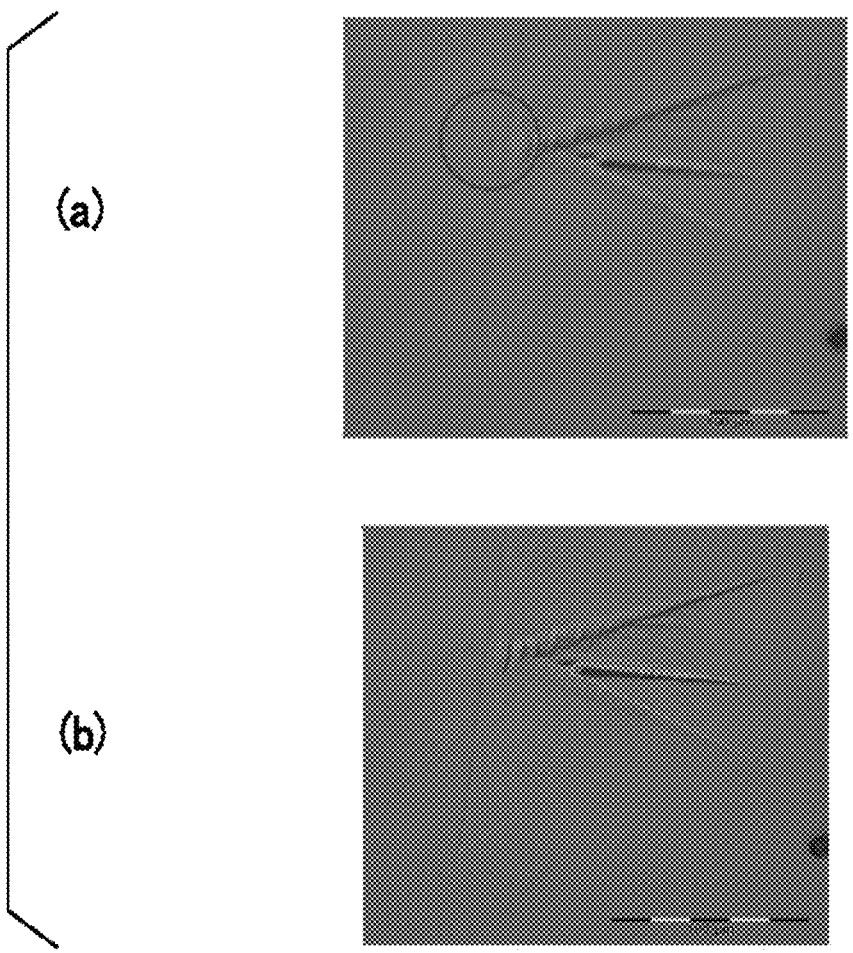
FIG. 4 shows an optical microscope image of a triangular defect having a piece of a member which is placed in a typical chamber as a starting point.

Hereinafter, a SiC epitaxial wafer manufacturing method and a SiC epitaxial wafer to which the invention is applied will be described in detail with reference to the drawings.

In the drawings used in the following description, in some cases, characteristic portions are enlarged in order to facilitate the understanding of the characteristics for convenience and, for example, the dimensional ratio of each component is different from the actual dimensional ratio. In addition, in the following description, materials and dimensions are illustrative examples and the invention is not limited thereto. The materials and dimensions can be appropriately changed without departing from the scope and spirit of the invention.

[SiC Epitaxial Wafer Manufacturing Method(First Embodiment)]

A SiC epitaxial wafer manufacturing method according to an embodiment of the invention is a method which manufactures a SiC epitaxial wafer including a SiC epitaxial layer on a SiC substrate using a SiC-CVD furnace that is installed in a glove box and includes a SiC substrate placement process of placing the SiC substrate in the SiC-CVD furnace while circulating gas in the glove box.

It is preferable to perform the circulation of the gas before and after the SiC substrate is placed in the SiC-CVD furnace. In addition, it is preferable to perform the circulation of the gas at least three minutes before the SiC substrate is placed in the SiC-CVD furnace.

It is possible to grow a SiC epitaxial film, with particle number density being reduced in the glove box. Therefore, it is possible to manufacture a SiC epitaxial wafer in which the density (surface density) of triangular defects having existing particles in the glove box, which are attached to the SiC substrate before the SiC epitaxial film is grown.

It is preferable that the SiC substrate placement process be performed after it is checked that the particle number density in the glove box is equal to or less than a predetermined value. In this case, it is possible to manage the density (surface density) of the triangular defects having the particles in the glove box, which are attached to the SiC substrate before the SiC epitaxial film is grown, as the starting points.

FIGS. 8 to 17 show the measurement results of the number of particles per cubic feet in the glove box before and after a cover of the SiC-CVD furnace (chamber) is opened and closed during a SiC substrate placement operation. Hot Wall SiC CVD (VP2400HW) manufactured by Aixtron Corporation was used as the glove box and the SiC-CVD furnace and a filter that had a particle removal ratio of 99.97% or more with respect to particles with a size of 0.3 μm at which the removal ratio was the minimum was used. Aero Track 9110 manufactured by Nitta Corporation was used as a particle counter. The horizontal axis indicates time (minute) and the vertical axis indicates the particle number density (particles/ft$^3$: the number of particles per cubic feet).

In FIGS. 8 to 17, "♦" (operation 1) indicates the measurement result of the particle number density in the glove box in an example of the invention in which the cover of the SiC-CVD furnace (chamber) is opened and closed to circulate gas 30 minutes before the SiC substrate placement operation starts (that is, when the cover is opened) and then the SiC substrate placement operation is performed. In addition, "□" (operation 2), "Δ" (operation 3), "x" (operation 4), and "*" (operation 5) are the measurement results of the particle number density in the glove box in comparative examples in which gas is circulated 30 minutes before the SiC substrate placement operation starts and the circulation is stopped when the SiC substrate placement operation starts. In FIGS. 8 to 17, the vertical axis between 30 minutes and 31 minutes indicates the boundary between data when the circulation is turned on and data when the circulation is turned off in the comparative example.

Figure 8:
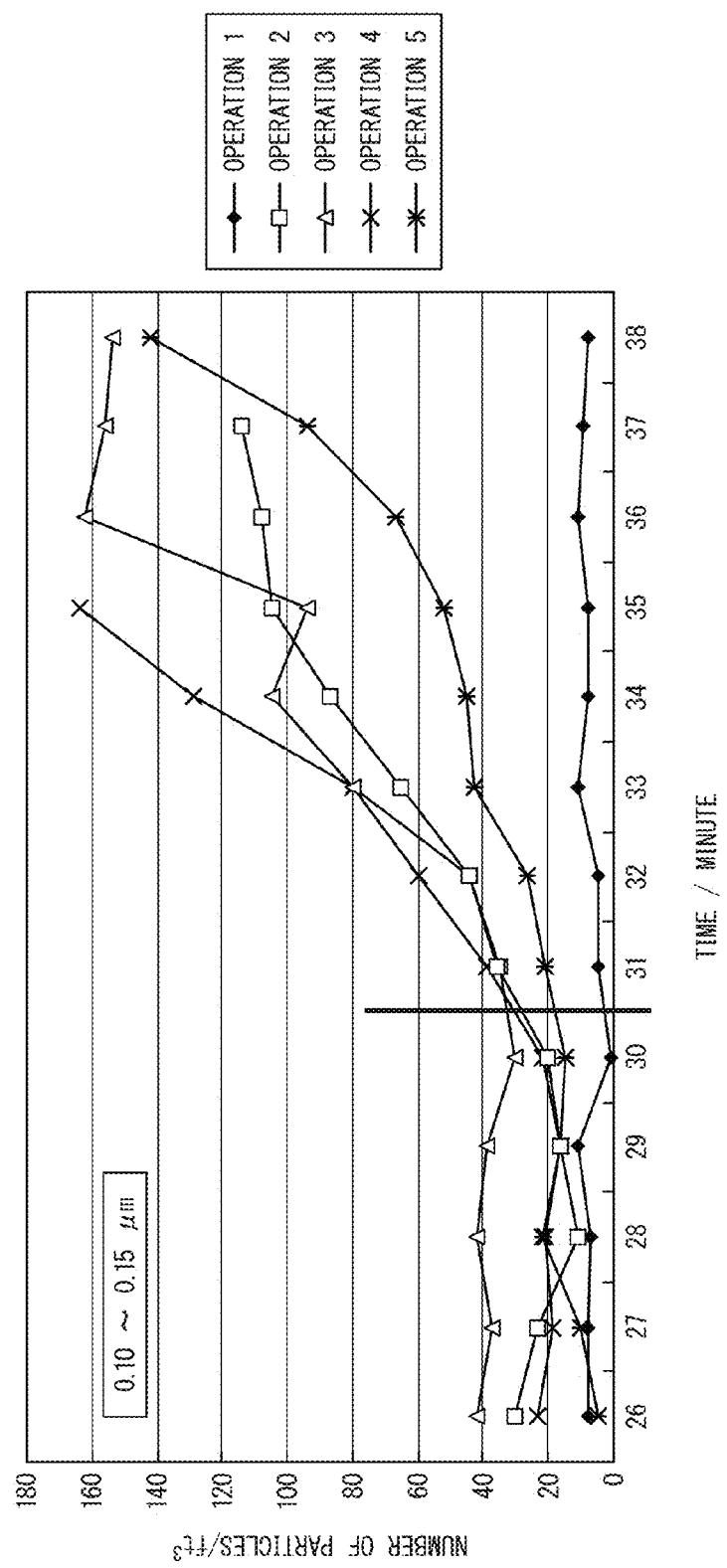
FIG. 8 is a graph showing the measurement result of the density of the number of particles with a size that is equal to or greater than 0.1 μm and less than 0.15 μm.

FIG. 8 shows the measurement results of the density of the number of particles with a size that is equal to or greater than 0.1 μm and less than 0.15 μm. The "size" is based on "size classification" by the particle counter.

In the comparative examples ("□", "Δ", "x", and "*"), after the SiC substrate placement operation started, that is, after a few minutes elapsed from the opening of the cover, the particle number density increased several times although there was a variation in the measurement results. In contrast, in the example ("♦"), there was little change in the particle number density before and after the SiC substrate placement operation started and the particle number density was equal to or less than 10 particles/ft$^3$.

Figure 9:
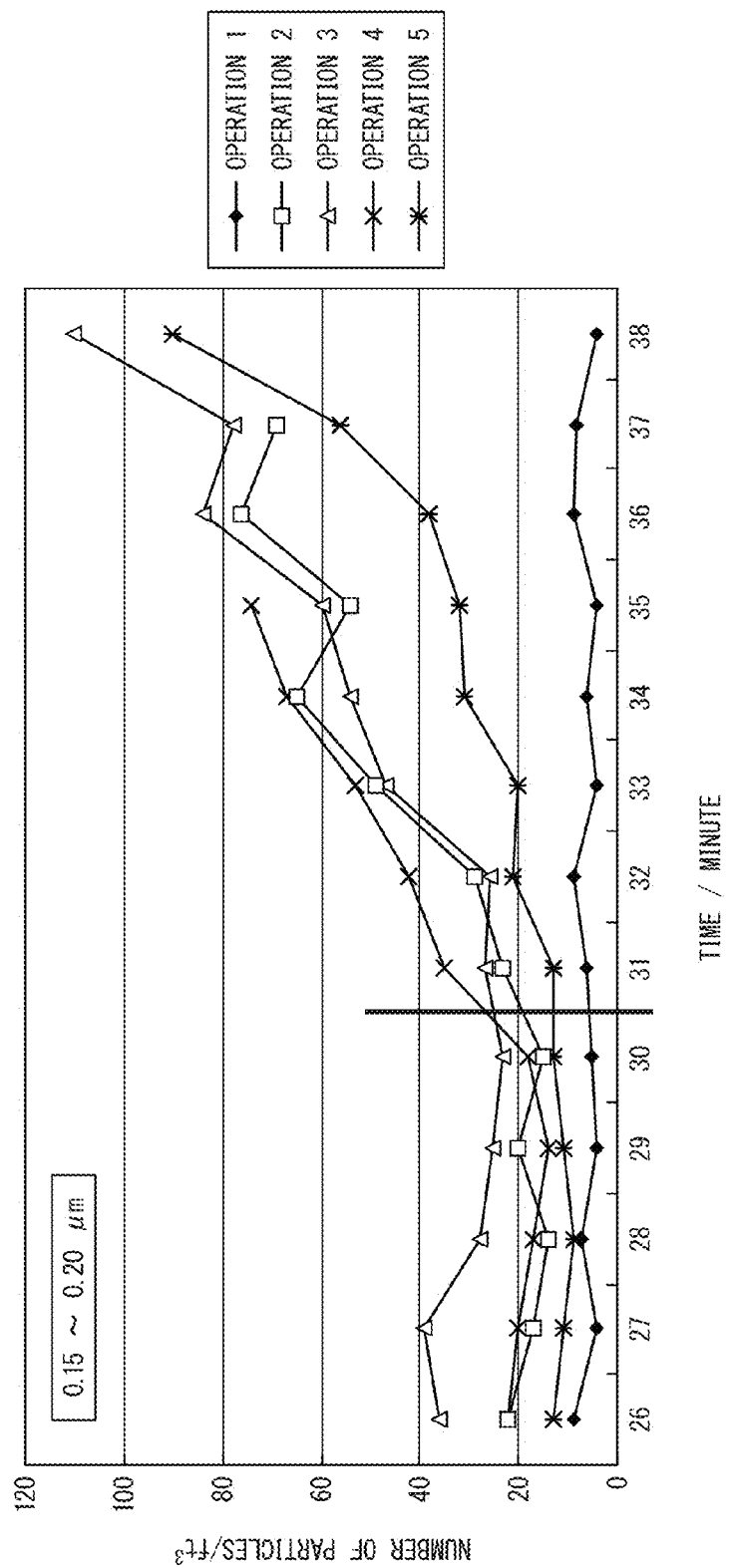
FIG. 9 is a graph showing the measurement result of the density of the number of particles with a size that is equal to or greater than 0.15 μm and less than 0.2 μm.

FIG. 9 shows the measurement results of the density of the number of particles with a size that is equal to or greater than 0.15 μm and less than 0.2 μm. In the comparative examples ("□", "Δ", "x", and "*"), after the SiC substrate placement operation started, that is, after a few minutes elapsed from the opening of the cover, the particle number density increased several times although there was a variation in the measurement results. In contrast, in the example ("♦"), there was little change in the particle number density before and after the SiC substrate placement operation started and the particle number density was equal to or less than 10 particles/ft$^3$.

Figure 10:
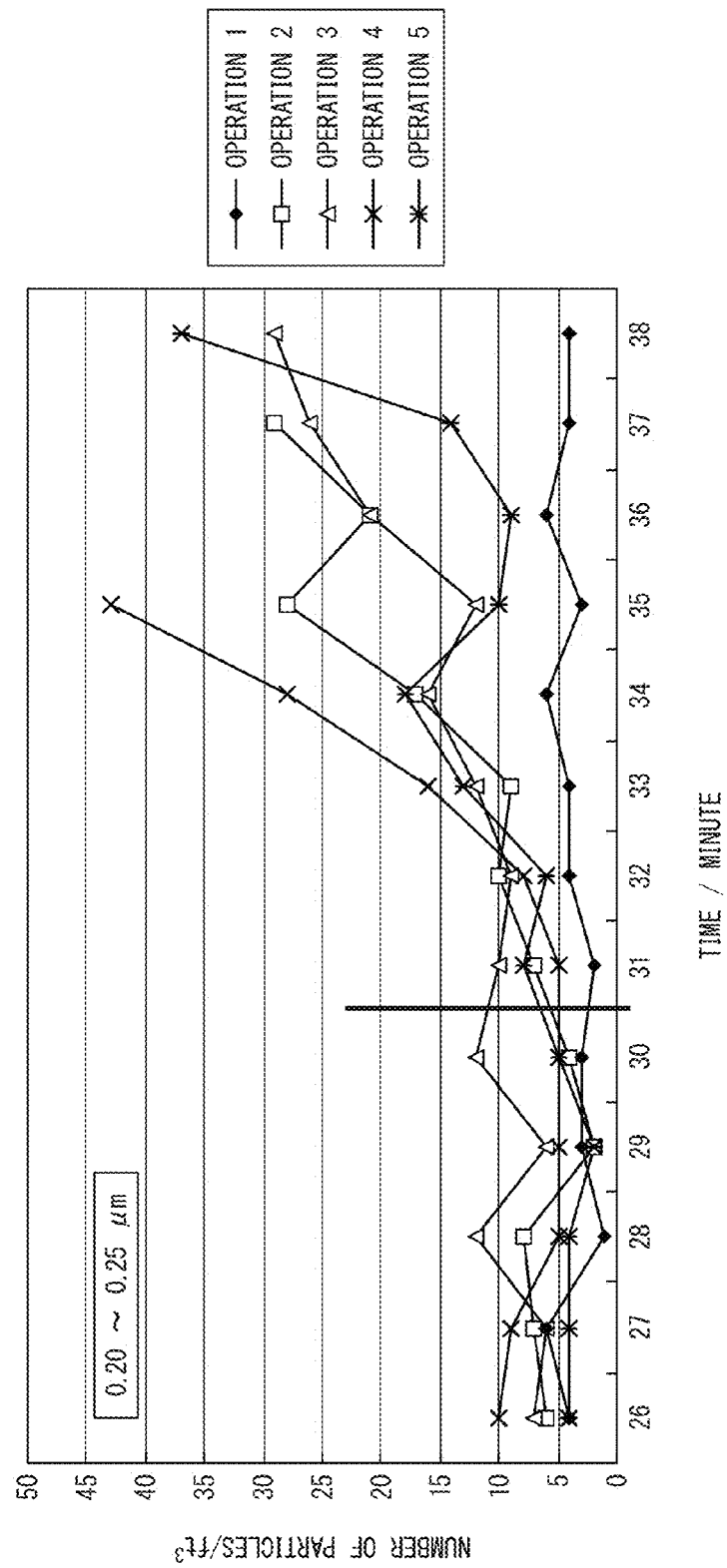
FIG. 10 is a graph showing the measurement result of the density of the number of particles with a size that is equal to or greater than 0.2 μm and less than 0.25 μm.

FIG. 10 shows the measurement results of the density of the number of particles with a size that is equal to or greater than 0.2 μm and less than 0.25 μm.

In the comparative examples ("□", "Δ", "x", and "*"), after the SiC substrate placement operation started, that is, after a few minutes elapsed from the opening of the cover, the particle number density increased several times although there was a variation in the measurement results. In contrast, in the example ("♦"), there was little change in the particle number density before and after the SiC substrate placement operation started and the particle number density was equal to or less than 6 particles/ft$^3$.

Figure 11:
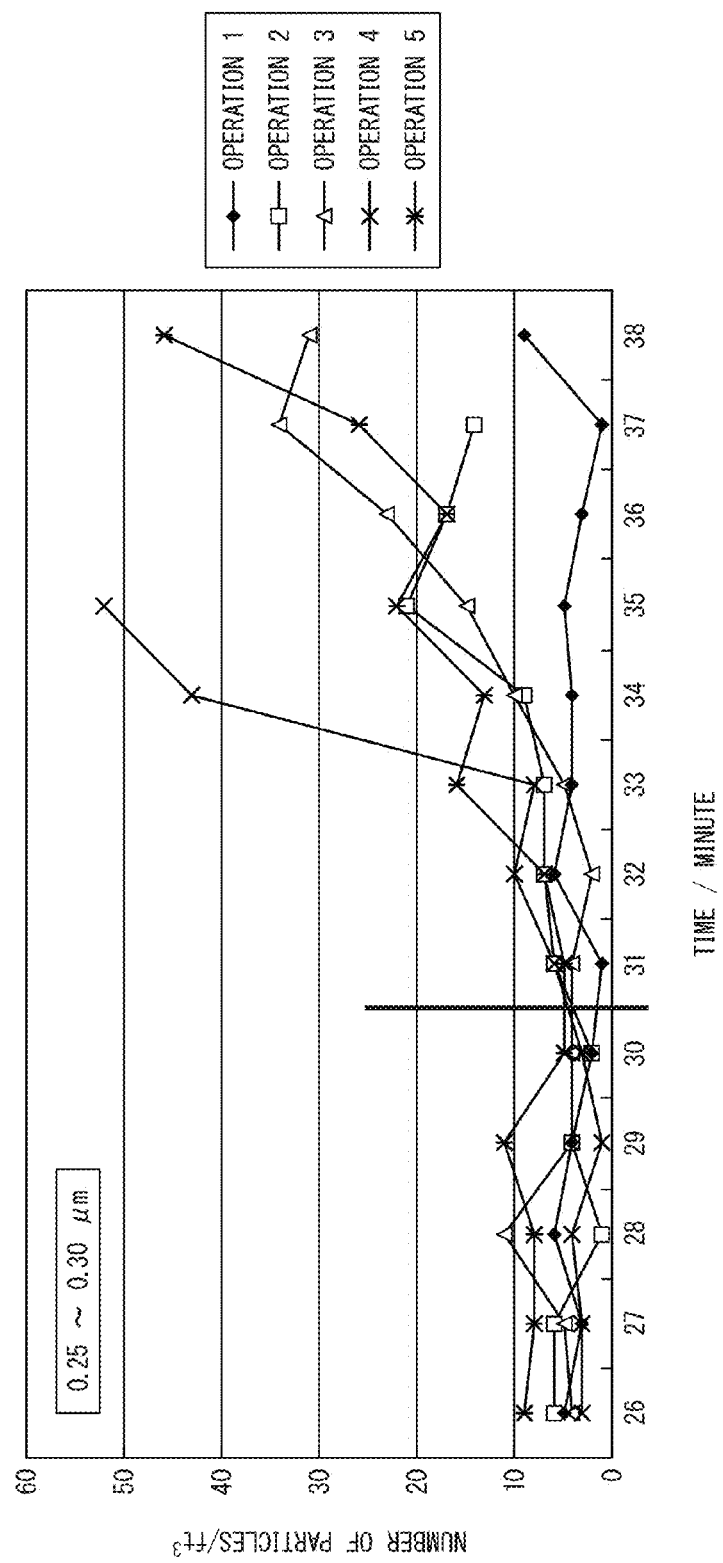
FIG. 11 is a graph showing the measurement result of the density of the number of particles with a size that is equal to or greater than 0.25 μm and less than 0.3 μm.

FIG. 11 shows the measurement results of the density of the number of particles with a size that is equal to or greater than 0.25 μm and less than 0.3 μm.

In the comparative examples ("□", "Δ", "x", and "*"), after the SiC substrate placement operation started, that is, after a few minutes elapsed from the opening of the cover, the particle number density increased several times although there was a variation in the measurement results. In contrast, in the example ("♦"), there was little change in the particle number density before and after the SiC substrate placement operation started and the particle number density was equal to or less than 10 particles/ft$^3$.

Figure 12:
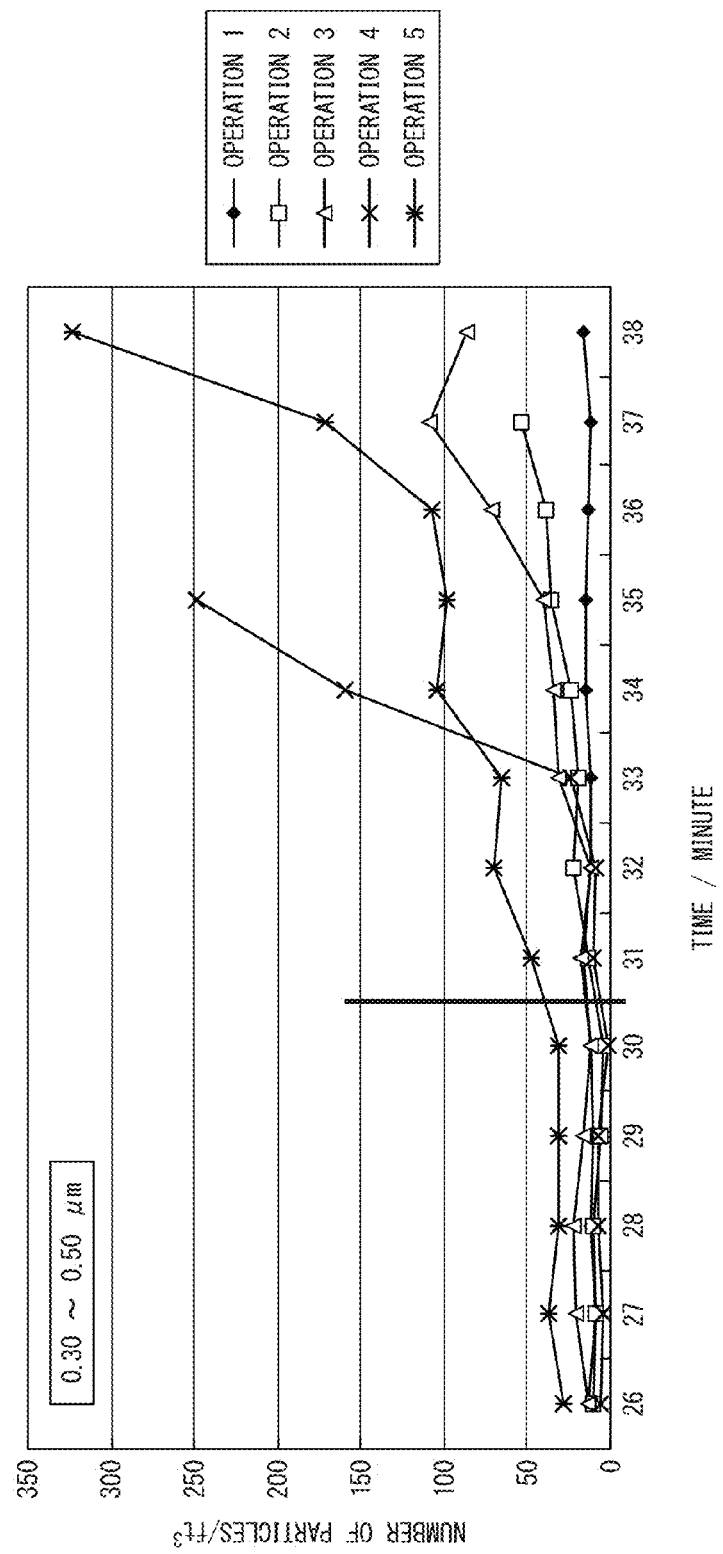
FIG. 12 is a graph showing the measurement result of the density of the number of particles with a size that is equal to or greater than 0.3 μm and less than 0.5 μm.

FIG. 12 shows the measurement results of the density of the number of particles with a size that is equal to or greater than 0.3 μm and less than 0.5 μm.

In the comparative examples ("□", "Δ", "x", and "*"), after the SiC substrate placement operation started, that is, after 5 minutes elapsed from the opening of the cover, the particle number density increased several times although there was a variation in the measurement results. In contrast, in the example ("◆"), there was little change in the particle number density before and after the SiC substrate placement operation started and the particle number density was equal to or less than 20 particles/ft$^3$.

The difference in the particle number density in this case is less than the difference in the particle number density between the example and the comparative examples when the size is equal to or less than 0.3 μm.

Figure 13:
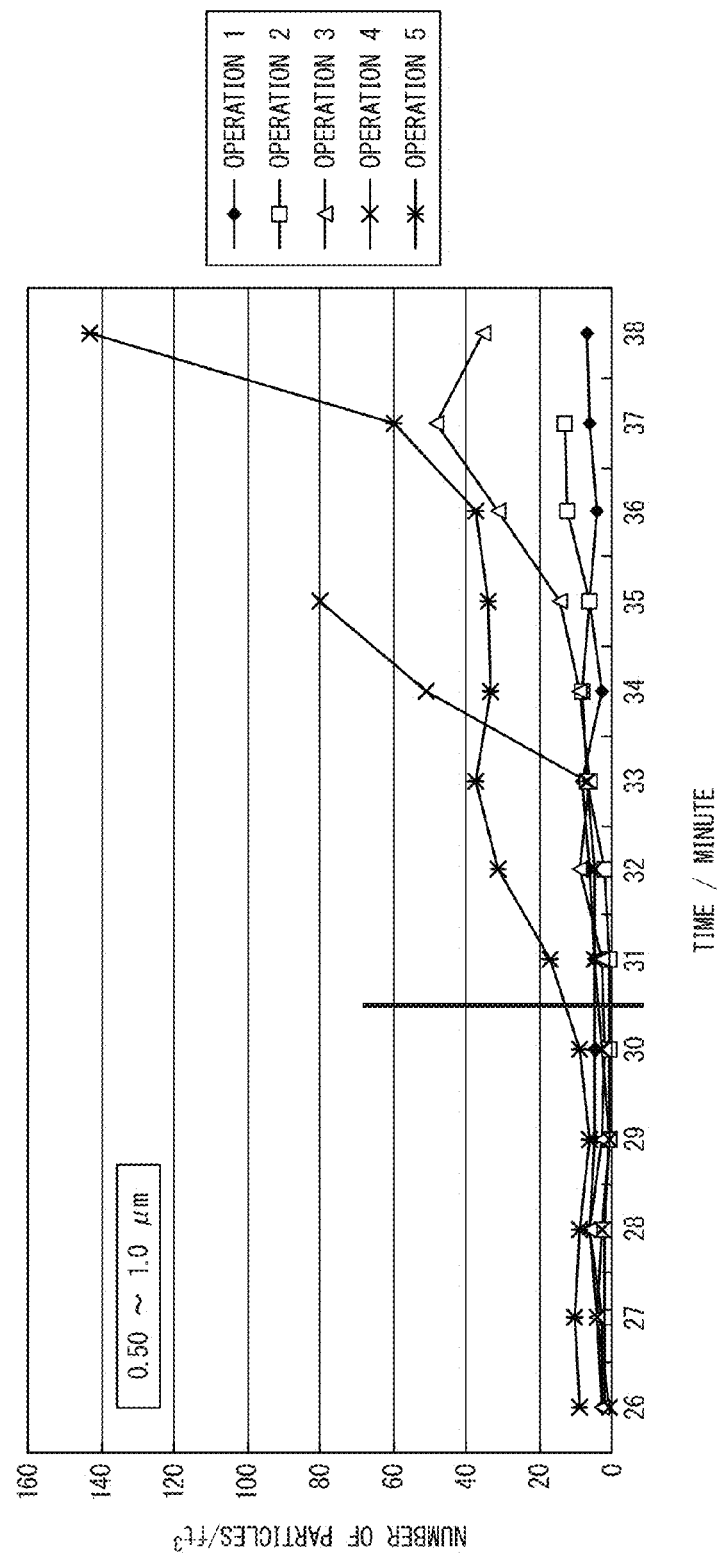
FIG. 13 is a graph showing the measurement result of the density of the number of particles with a size that is equal to or greater than 0.5 μm and less than 1.0 μm.

FIG. 13 shows the measurement results of the density of the number of particles with a size that is equal to or greater than 0.5 μm and less than 1.0 μm.

Among the comparative examples ("□", "Δ", "x", and "*"), in some comparative examples, after the SiC substrate placement operation started, that is, after a few minutes elapsed from the opening of the cover, the particle number density increased several times. However, in some comparative examples, there was no change in the particle number density. In contrast, in the example ("◆"), in the case of the size, there was little change in the particle number density before and after the SiC substrate placement operation started and the particle number density was equal to or less than 10 particles/ft$^3$.

Figure 14:
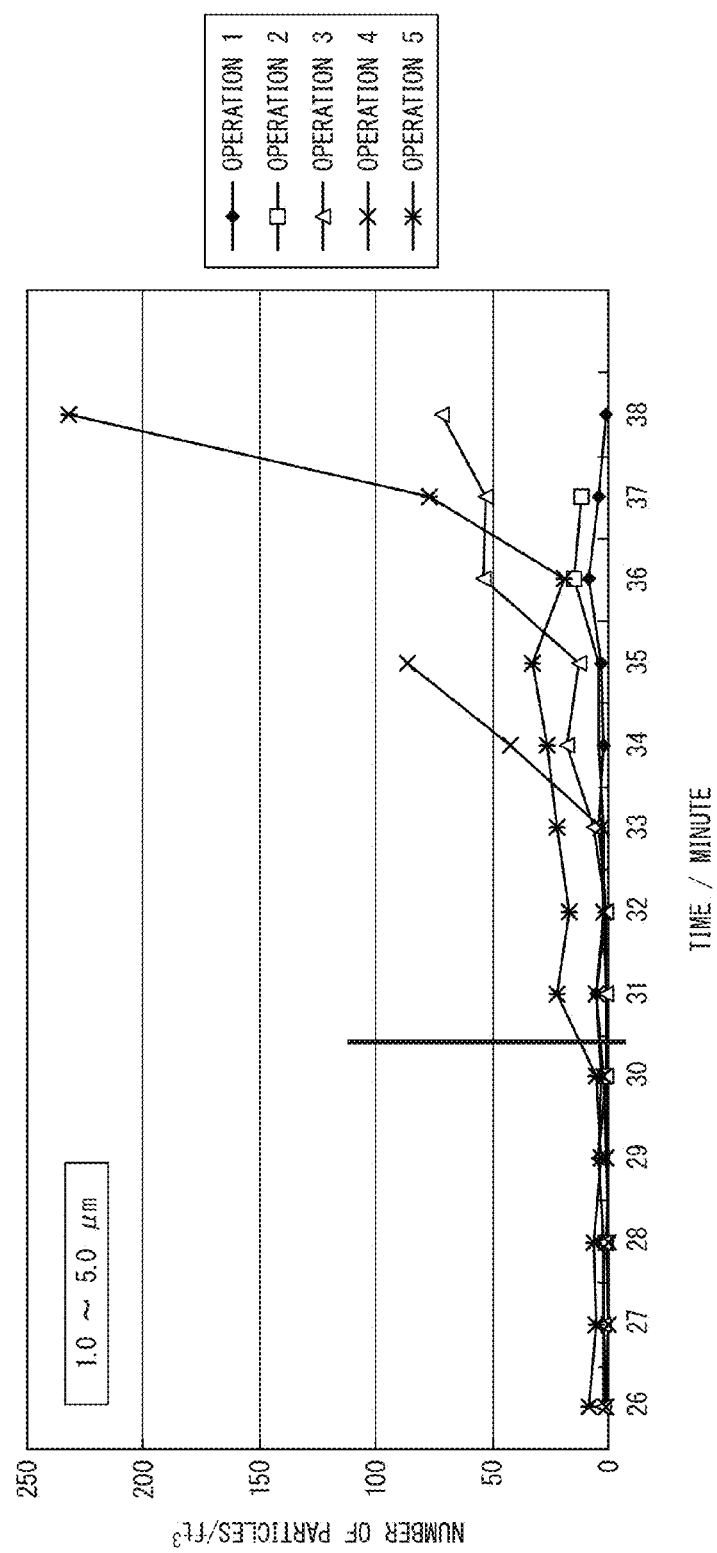
FIG. 14 is a graph showing the measurement result of the density of the number of particles with a size that is equal to or greater than 1.0 μm and less than 5.0 μm.

FIG. 14 shows the measurement results of the density of the number of particles with a size that is equal to or greater than 1.0 μm and less than 5.0 μm.

Among the comparative examples ("□", "Δ", "x", and "*"), in some comparative examples, after the SiC substrate placement operation started, that is, after 4 or more minutes elapsed from the opening of the cover, the particle number density increased several times. However, in some comparative examples, there was no change in the particle number density. In contrast, in the example ("◆"), in the case of the size, there was little change in the particle number density before and after the SiC substrate placement operation started and the particle number density was equal to or less than 10 particles/ft$^3$.

Figure 15:
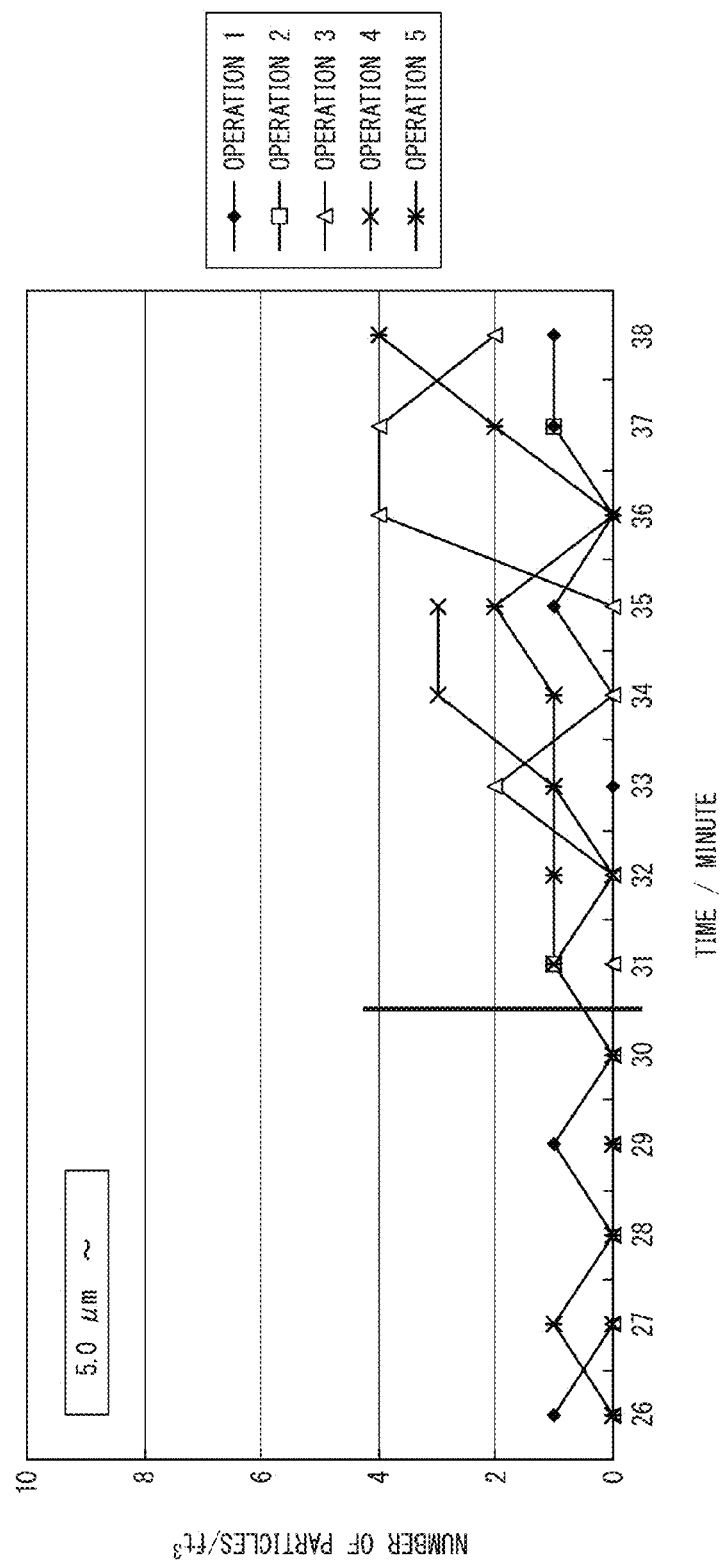
FIG. 15 is a graph showing the measurement result of the density of the number of particles with a size that is equal to or greater than 5.0 μm.

FIG. 15 shows the measurement results of the density of the number of particles with a size that is equal to or greater than 5.0 μm.

In all of the example ("◆") and the comparative examples ("□", "Δ", "x", and "*"), the particle number density was less than that when the size was equal to or less than 5.0 μm and there was no clear difference therebetween.

Figure 16:
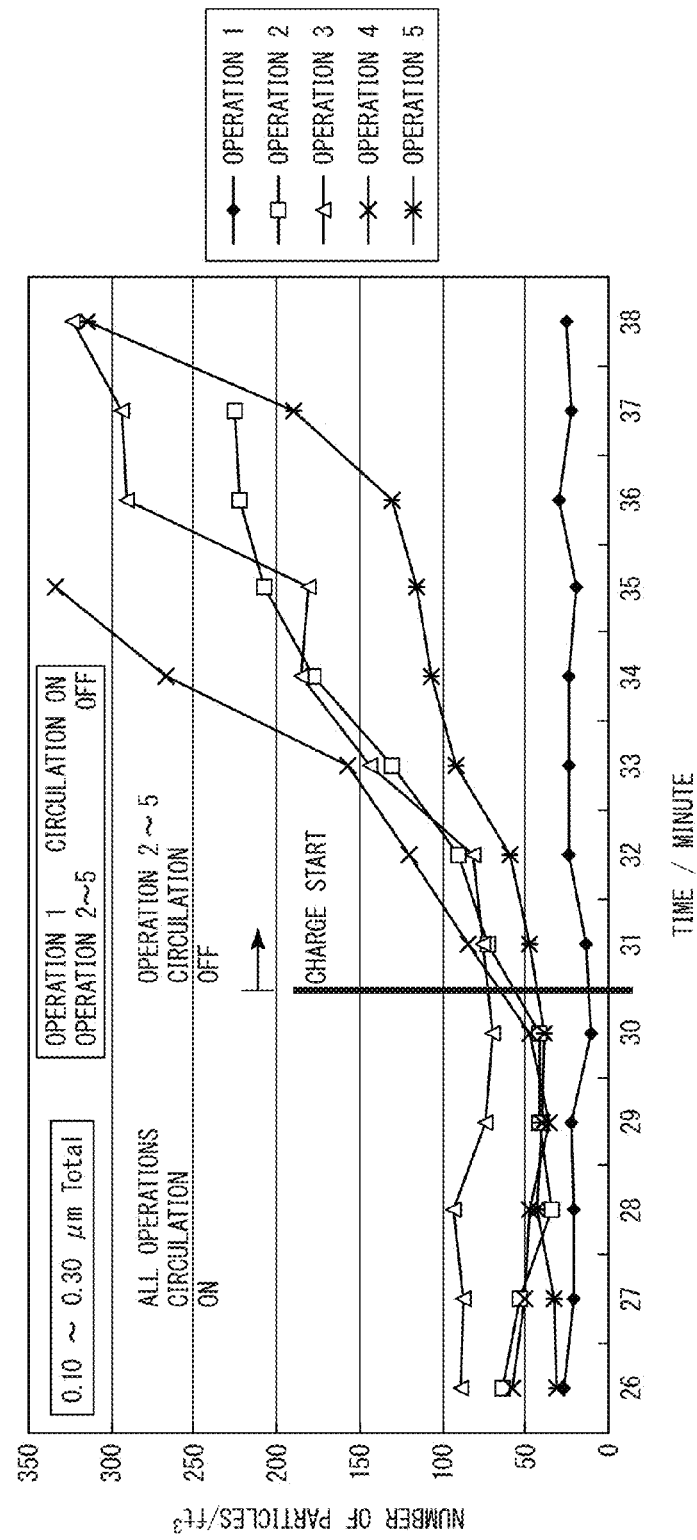
FIG. 16 is a graph showing the measurement result of the density of the number of particles with a size that is equal to or greater than 0.1 μm and less than 0.3 μm.

FIG. 16 shows the measurement results of the density of the number of particles with a size that is equal to or greater than 0.1 μm and less than 0.3 μm (the sum of the results shown in FIGS. 8 to 11).

In the comparative examples ("□", "Δ", "x", and "*"), after the SiC substrate placement operation started, that is, after a few minutes elapsed from the opening of the cover, the particle number density increased several times although there was a variation in the measurement results. In contrast, in the example ("◆"), there was little change in the particle number density before and after the SiC substrate placement operation started and the particle number density was equal to or less than 30 particles/ft$^3$. As such, when the invention is applied, it is possible to reduce the number density of particles with a size that is equal to or greater than 0.1 μm and less than 0.3 μm in the glove box to 30 particles/ft$^3$ or less.

Figure 17:
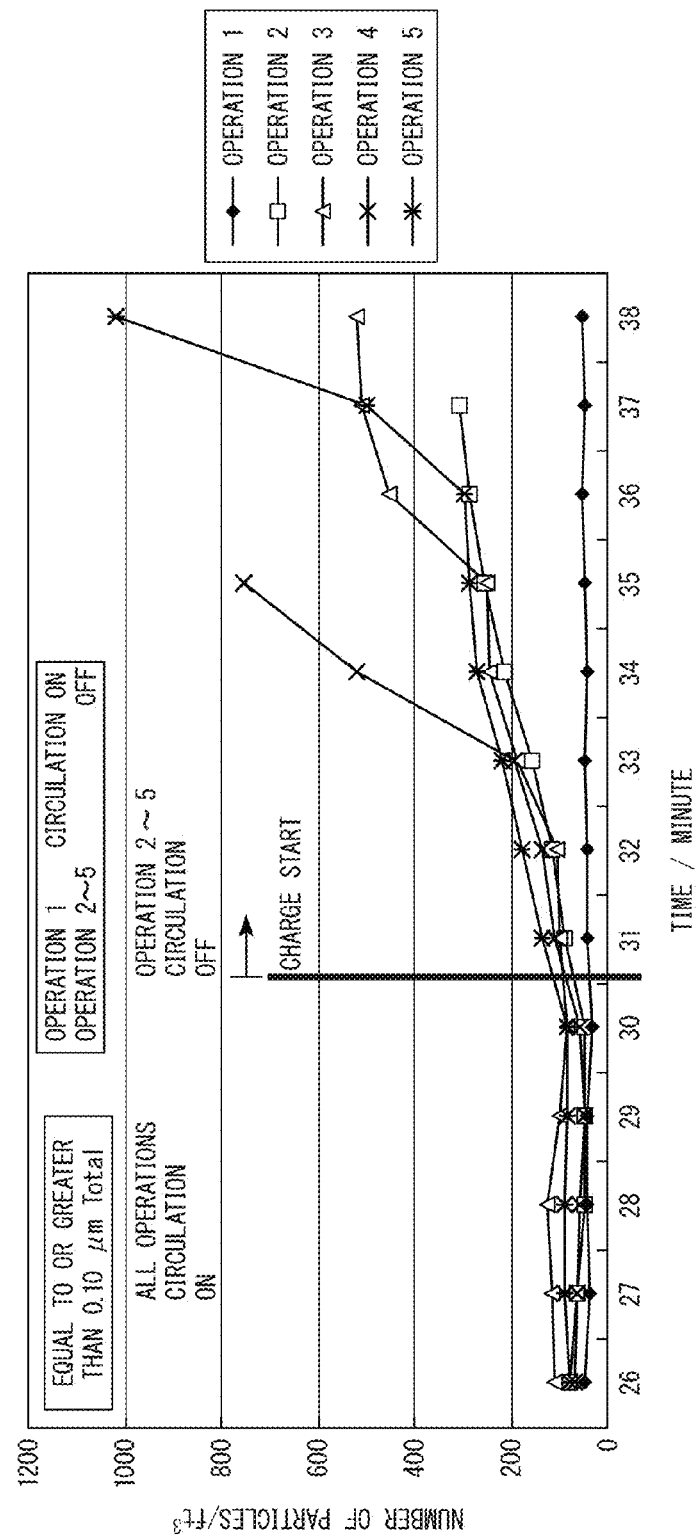
FIG. 17 is a graph showing the measurement result of the density of the number of particles with a size that is equal to or greater than 0.1 μm.

FIG. 17 shows the measurement results of the density of the number of particles with a size that is equal to or greater than 0.1 μm (the sum of the results shown in FIGS. 8 to 16).

In the comparative examples ("□", "Δ", "x", and "*"), after the SiC substrate placement operation started, that is, after a few minutes elapsed from the opening of the cover, the particle number density increased several times although there was a variation in the measurement results. In contrast, in the example ("◆"), there was little change in the particle number density before and after the SiC substrate placement operation started and the particle number density was equal to or less than 60 particles/ft$^3$. As such, when the invention is applied, it is possible to reduce the number density of particles with a size equal to or greater than 0.1 μm in the glove box to 60 particles/ft$^3$ or less.

It is considered that the above-mentioned results are affected by the performance of the filter. A filter which was used in the experimental results had a particle removal rate of 99.97% or more with respect to particles with a size of 0.3 μm at which the removal ratio was the minimum. The invention is effective in the removal of particles with a size of about 0.3 μm. According to the SiC epitaxial wafer manufacturing method of the invention, it is possible to manufacture a SiC epitaxial wafer with a low density of triangular defects.

In the SiC epitaxial wafer manufacturing method according to the invention, when the SiC epitaxial wafers are continuously manufactured, a SiC-CVD furnace is preferably used which includes a susceptor that has a wafer mounting portion on which a wafer is placed, a ceiling that faces the upper surface of the susceptor such that a reaction space is formed between the ceiling and the susceptor, and a shielding plate that is arranged so close to the lower surface of the ceiling that a deposit is prevented from being attached to the lower surface of the ceiling. Preferably, a surface of the shielding plate which faces the susceptor is coated with a silicon carbide film or a pyrolytic carbon film, or the shielding plate is made of silicon carbide. Preferably, the SiC epitaxial wafer manufacturing method includes a process which measures the surface density of triangular defects having a material of a member which is placed in the SiC-CVD furnace as a starting point in the SiC epitaxial film of the previously manufactured SiC epitaxial wafer and manufactures the next SiC epitaxial wafer.

In this case, it is possible to manufacture a SiC epitaxial wafer in which the surface density of triangular defects having the material piece of the member in the chamber as the starting point is reduced. In addition, a structure was used in which the surface of the shielding plate that faces the susceptor was coated with one of a silicon carbide film and a pyrolytic carbon film, or the shielding plate was made of silicon carbide. Therefore, the shielding plate is less likely to deteriorate (when the surface of the shielding plate is coated with the silicon carbide film or when the shielding plate is made of silicon carbide, the shielding plate is less likely to deteriorate since a SiC film deposited on the shielding plate and the film coating the shielding plate or the shielding plate are made of the same material and there is no difference in their thermal expansion coefficient. When a carbon material base is used as the shielding plate and the shielding plate is coated with the pyrolytic carbon film, the shielding plate is less likely to deteriorate since there is a small difference in the thermal expansion coefficient between the base and the pyrolytic carbon film) and the number of material pieces which fall from the shielding plate onto the wafer is reduced. In addition, it is possible to use the shielding plate for a long time.

When the measurement result shows that surface density of the triangular defects having the piece of the member which is placed in the SiC-CVD furnace as the starting point is greater than a predetermined value, it is preferable to replace the shielding plate and to manufacture the next SiC epitaxial wafer.

In this case, it is possible to manufacture a SiC epitaxial wafer in which the surface density of the triangular defects having the piece of the member which is placed in the chamber as the starting point is equal to or less than a predetermined value.

In the SiC epitaxial wafer manufacturing method according to the invention, when the SiC epitaxial wafer is continuously manufactured, a SiC-CVD furnace is preferably used which includes a susceptor that has a wafer mounting portion on which a wafer is placed and a ceiling that faces the upper surface of the susceptor such that a reaction space is formed between the ceiling and the susceptor. Preferably, a surface of the ceiling which faces the susceptor is coated with one of a silicon carbide film and a pyrolytic carbon film, or the ceiling is made of silicon carbide. Preferably, the SiC epitaxial wafer manufacturing method includes a process which measures the surface density of triangular defects having a material piece of a member in the SiC-CVD furnace as a starting point in the SiC epitaxial film of the previously manufactured SiC epitaxial wafer and manufactures the next SiC epitaxial wafer.

In this case, it is possible to manufacture a SiC epitaxial wafer in which the surface density of triangular defects having a material piece of a member in the chamber as a starting point. In addition, since the structure is used in which the surface of the ceiling that faces the susceptor is coated with one of a silicon carbide film and a pyrolytic carbon film, or the ceiling is made of silicon carbide, the ceiling is less likely to deteriorate (when the ceiling is coated with the silicon carbide film or when the ceiling is made of silicon carbide, the ceiling is less likely to deteriorate since a SiC film deposited on the ceiling and the film coating the ceiling or the ceiling are made of the same material and there is no difference in thermal expansion coefficient. When a carbon material base is used as the ceiling and the ceiling is coated with the pyrolytic carbon film, the ceiling is less likely to deteriorate since there is a small difference in the thermal expansion coefficient between the base and the pyrolytic carbon film) and the number of material pieces which fall from the ceiling onto the wafer is reduced. In addition, it is possible to use the ceiling for a long time.

When the measurement result shows that the surface density of the triangular defects having the piece of the member which is placed in the SiC-CVD furnace as the starting point is greater than a predetermined value, it is preferable to replace the ceiling and to manufacture the next SiC epitaxial wafer.

In this case, it is possible to manufacture a SiC epitaxial wafer in which the surface density of the triangular defects having the piece of the member which is placed in the chamber as the starting point is equal to or less than a predetermined value.

<SiC Substrate>

It is preferable that the SiC substrate be made of a SiC single crystal. Any polytype can be used as the SiC single crystal substrate. 4H—SiC which is mainly used to manufacture a practical SIC device can be used. A SiC single crystal substrate which is processed from a bulk crystal produced by, for example, a sublimation method is used as a substrate of the SiC device. In general, a SiC epitaxial layer which serves as an active region of the SiC device is formed on the SiC single crystal substrate by a chemical vapor deposition (CVD) method.

Any off-angle may be used as the off-angle of the SiC single crystal substrate. The off-angle is not particularly limited. However, a small off-angle of, for example, 0.4° to 5° is preferable in order to reduce costs. The angle of 0.4° is the lower limit of the off-angle at which step-flow growth can be achieved.

When the SiC single crystal substrate has a size of up to about 2 inches, the off-angle of the SiC single crystal substrate is mainly 8°. At this off-angle, the terrace width of the surface of the wafer is small and the step-flow growth can be easily achieved. However, the number of wafers obtained from a SiC ingot decreases as the off-angle increases. Therefore, the off-angle of a SiC substrate with a size of 3 inches or more is mainly about 4°.

As the off-angle decreases, the terrace width of the surface of the SiC single crystal substrate increases. Therefore, a variation is likely to occur in the speed at which migration atoms are taken at a step end, that is, the growth speed of the step end. As a result, a step with a high growth speed overtakes a step with a low growth speed and is combined with the step with a low growth speed and step bunching is likely to occur. For example, in a substrate with an off-angle of 0.4°, the terrace width is 10 times more than the terrace width of a substrate with an off-angle of 4° and the length of the step-flow growth is increased by one digit. Therefore, it is noted that step-flow growth conditions used in the substrate with an off-angle of 4° needs to be adjusted.

A SiC single crystal substrate in which a growth surface of a SiC epitaxial layer is processed in a convex shape can be used.

When the SiC epitaxial wafer is manufactured (the SiC epitaxial layer is formed (grown)), the rear surface of the SiC single crystal substrate is directly heated from a heated susceptor. However, the front surface (the surface on which the SiC epitaxial layer is formed) is exposed to a vacuum space and is not directly heated. Since hydrogen which is a carrier gas flows on the front surface, heat is dissipated. From this situation, the temperature of the front surface is lower than that of the rear surface during epitaxial growth. The magnitude of thermal expansion of the front surface is less than that of the rear surface due to the difference in temperature and the front surface of the SiC single crystal substrate is deformed in a concave shape during epitaxial growth. Therefore, when the SiC single crystal substrate in which the growth surface of the SiC epitaxial layer is processed in a convex shape is used, epitaxial growth can be performed in a state in which the concaveness (warping) of the SiC single crystal substrate during epitaxial growth is removed.

The thickness of the SiC epitaxial layer is not particularly limited. However, for example, when the SiC epitaxial layer is formed for 2.5 hours at a typical growth speed of 4 µm/h, the thickness of the SiC epitaxial layer is 10 µm.

<SiC-CVD Furnace>

The SiC-CVD furnace is not particularly limited.

Figure 18:
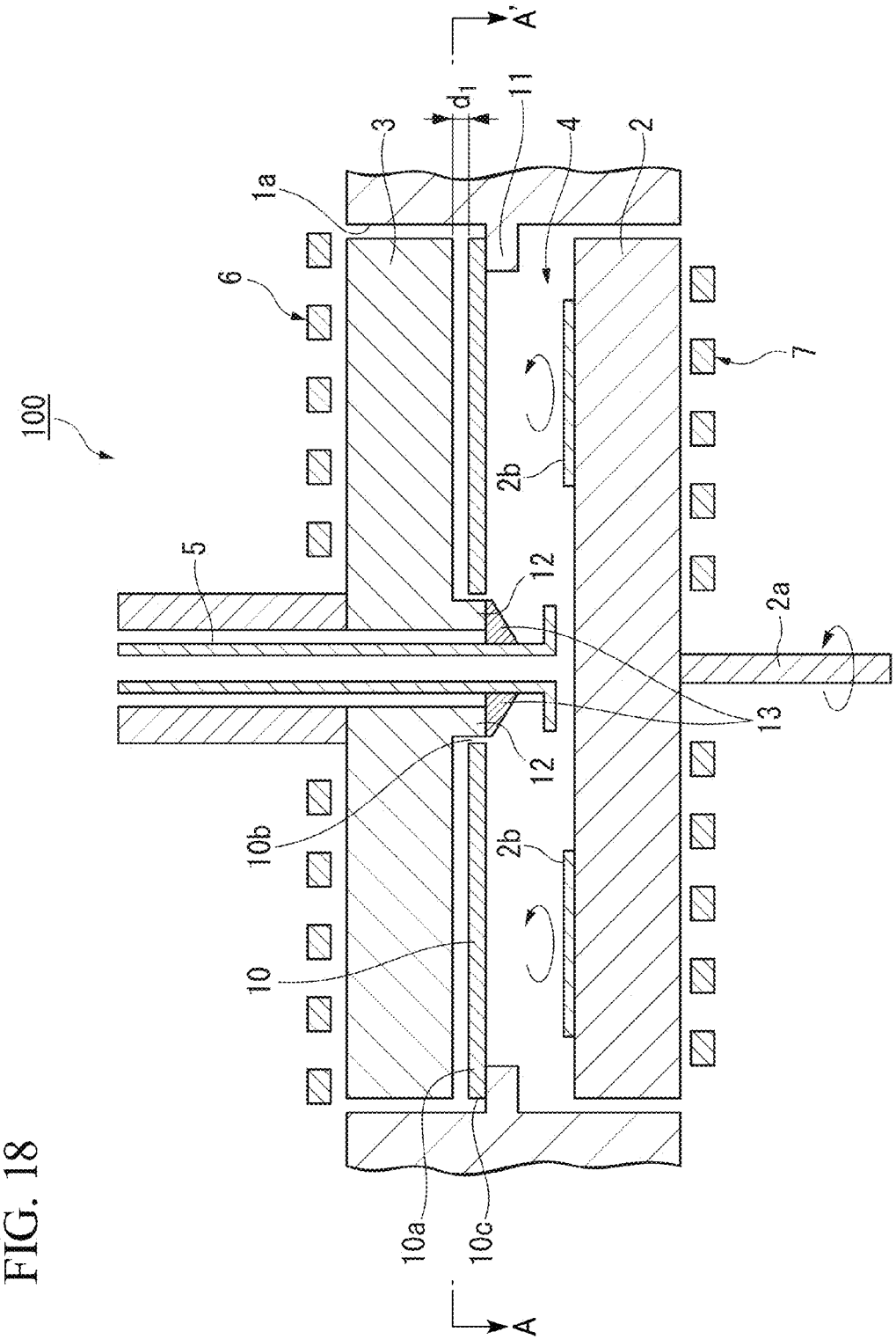
FIG. 18 is a schematic cross-sectional view showing an epitaxial wafer manufacturing apparatus used in the embodiment of the invention.
Figure 19:
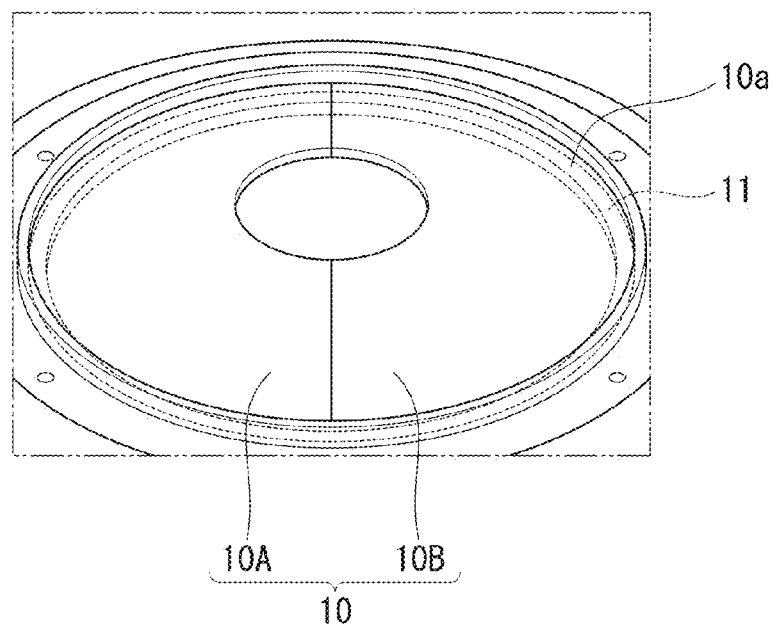
FIG. 19 is a perspective view showing the lower side of the epitaxial wafer manufacturing apparatus along the line A-A' of FIG. 18.
Figure 20:
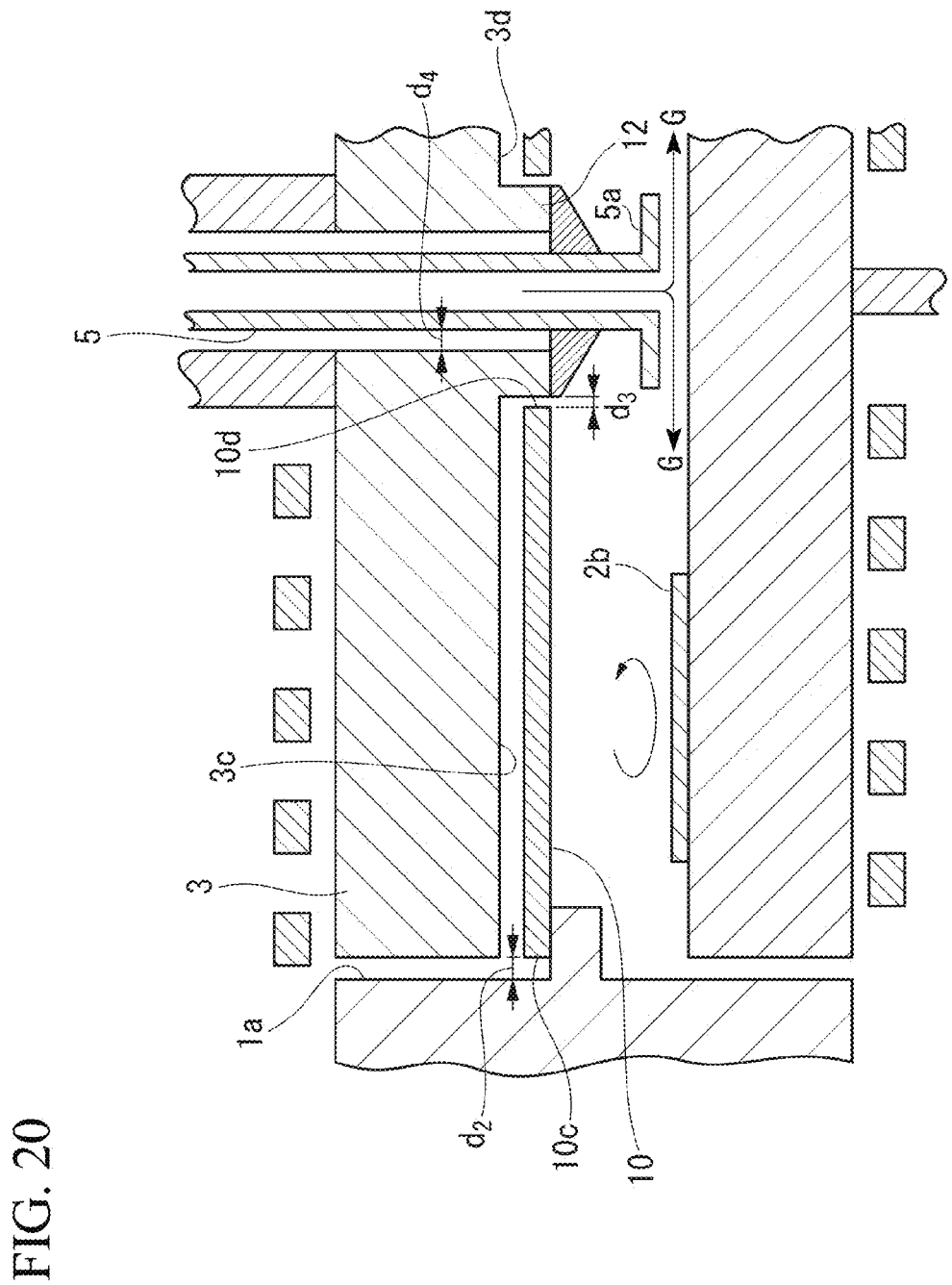
FIG. 20 is a schematic enlarged view showing the periphery of a shielding plate shown in FIG. 19.

FIG. 18 is a schematic cross-sectional view showing a portion of the SiC-CVD furnace which is used in the SiC epitaxial wafer manufacturing method according to the invention. FIG. 19 is a perspective view showing the lower side of the SiC-CVD furnace along the line A-A' of FIG. 18. FIG. 20 is an enlarged view schematically showing the periphery of the shielding plate shown in FIG. 18.

The SiC-CVD furnace which is used in the SiC epitaxial wafer manufacturing method according to the invention is, for example, a SiC-CVD furnace 100 shown in FIG. 18 that forms an epitaxial layer on the surface of a wafer while being supplied with a raw material gas and includes a plurality of mounting portions 2b on which wafers are placed, a susceptor 2 on which the plurality of mounting portions 2b are arranged in a line in a circumferential direction, a ceiling 3 which faces the upper surface of the susceptor 2 such that a reaction space 4 is formed between the ceiling 3 and the susceptor 2, and a shielding plate 10 that is arranged so close to the lower surface of the ceiling 3 that a deposit in a gas phase is prevented from being attached to the lower surface of the ceiling 3. A surface of the shielding plate 10 which faces the susceptor 2 is coated with one of a silicon carbide film and a pyrolytic carbon film, or the shielding plate 10 is made of silicon carbide.

For example, a raw material gas which includes, for example, silane ($SiH_4$) as a Si source and propane ($C_3H_8$) as a C source can be used. In addition, a carrier gas including hydrogen ($H_2$) can be used.

The SiC-CVD furnace 100 according to this embodiment further includes heating means 6 and 7 which are located below the susceptor 2 and above the ceiling, respectively, and heat the wafers placed on the mounting portions 2b, and a gas introduction pipe 5 which has a gas inlet through which the raw material gas is introduced from a central portion of the upper surface of the ceiling 3 to the reaction space 4 and supplies the raw material gas discharged from the gas inlet from the inside to the outside of the reaction space 4.

The heating means 6 and 7 are induction coils, can heat the ceiling 3 using high-frequency induction heating of the induction coils, can heat the shielding plate 10 using radiation heat from the heated ceiling 3, and can heat the wafers using radiation heat from the shielding plate 10.

In this embodiment, the wafer is heated by the heating means which are located below the susceptor 2 and above the ceiling. However, the heating means may be arranged only on the lower surface side of the susceptor 2.

Heating means for the SiC single crystal substrate is not limited to the above-mentioned heating means using high-frequency induction heating, but heating means using resistance heating may be used.

The ceiling 3 is supported by a supporting member 13 which is fixed to the gas introduction pipe 5 through a protrusion portion 12 that protrudes from a central portion of the lower surface of the ceiling 3 so as to be disposed in an opening portion 10b of the shielding plate 10. The protrusion portion 12 makes it difficult for gas to flow from an inner circumferential portion of the shielding plate 12 to a space between the shielding plate 10 and the ceiling 3.

As the ceiling 3, the following can be used: a ceiling which is made of a carbon material such as graphite; a ceiling which is made of silicon carbide; or a ceiling formed by coating a base made of a carbon material with a film made of SiC, pyrolytic carbon, TaC, or the like. The ceiling 3 is preferably made of a material which is less likely to be sublimated due to dust generation at a high temperature or mutual interaction with gas in the chamber.

The shielding plate 10 is configured so as to be detachably attached in the chamber. In this embodiment, an outer circumference portion 10a of the shielding plate 10 is placed on a supporting portion 11 that is provided on the surface of the inner wall of the chamber.

Since only the outer circumferential portion of the shielding plate 10 is supported, it is possible to detachably attach the shielding plate 10 in the chamber while avoiding the contact between the gas introduction pipe 5 which is maintained at a low temperature in order to introduce the raw material gas without being decomposed and the inner circumferential portion (the central portion in which the opening portion is formed) of the shielding plate 10 which is heated to a high temperature by the heating means.

The shielding plate 10 is preferably divided into a plurality of parts. In this embodiment, the shielding plate 10 is divided into two parts, that is, a pair of members 10A and 10B along the central line, as shown in FIG. 19. In this case, each of the pair of members 10A and 10B can be placed on the supporting portion 11. At the time of replacement, each member may be detached from the supporting portion 11. Therefore, operability is improved and the risk of damage is reduced during placement, replacement, and maintenance.

In addition, when the shielding plate 10 is divided into a plurality of parts, heat stress is reduced and warping or deformation is suppressed.

The shielding plate 10 generally prevents dust (graphite) from falling from the lower surface of the ceiling 3 which is made of graphite to the wafer to reduce the surface density of triangular defects having a material piece of the ceiling as a starting point. However, when a material piece of the shielding plate 10 falls to the wafer, the triangular defect having the material piece of the shielding plate as the starting point occurs. In order to suppress the occurrence of the triangular defect, the shielding plate 10 needs to be made of a material which is less likely to be sublimated due to dust emission at a high temperature or mutual interaction with gas in the chamber than the material forming the ceiling 3. Therefore, a shielding plate which is made of silicon carbide or a shielding plate formed by coating a graphite base with one of a silicon carbide film and a pyrolytic carbon film is used as the shielding plate 10.

The thickness of the silicon carbide film or the pyrolytic carbon film is preferably equal to or greater than 20 μm in order to suppress deterioration. In addition, the film thickness is preferably equal to or less than 100 μm in order to reduce stress based on a difference in thermal expansion coefficient from the graphite base.

At least the lower surface of the shielding plate 10 is preferably of a material with high adhesion to the SiC film in order to reduce the amount of downfall of the SiC film which is deposited in a gas phase, peels off, and falls to the SiC single crystal substrate or the SiC epitaxial layer. An example of this material is silicon carbide. An example of the shielding plate is a shielding plate having a surface coated with a silicon carbide film.

In this embodiment, the shielding plate 10 is preferably made of a material with high thermal conductivity since it needs to receive heat radiation from the ceiling 3, to be heated, to emit radiation heat, and to heat the wafer.

When the shielding plate 10 is made of silicon carbide, it can be manufactured by, for example, a chemical vapor deposition (CVD) method or sintering. However, the CVD method is preferable for manufacturing a shielding plate with a high-purity material.

It is preferable to roughen the surface of the shielding plate 10 using, for example, polishing in order to increase the adhesion of the surface, on which silicon carbide is deposited, to silicon carbide.

The thickness of the shielding plate 10 is preferably in the range of 2 mm to 6 mm in order to prevent a crack. The reason is as follows. The shielding plate 10 is easily cracked. When the thickness of the shielding plate 10 is less than 2 mm, the shielding plate 10 is excessively bent and cracked. When the thickness is greater than 6 mm, the shielding plate 10 is also cracked.

When the ceiling is made of silicon carbide, the thickness of the member is less than that of the ceiling and the shielding plate can be resistant to thermal strain even though the same material is used. Therefore, the shielding plate is less likely to be cracked.

The plurality of mounting portions 2b are arranged in a line in the circumferential direction on the disk-shaped susceptor 2 so as to surround the central portion of the susceptor 2. A rotating shaft 2a for revolution is attached to a central portion of the lower surface of the susceptor 2. The rotating shaft 2a for revolution is arranged immediately below the gas introduction pipe 5. A rotating shaft (not shown) for rotation is attached to each mounting portion 2b.

In this way, the susceptor 2 resolves the SiC single crystal substrate about the gas introduction pipe 5 and the SiC single crystal substrate and the mounting portion 2b are rotated about the center of the SiC single crystal substrate.

In the SiC-CVD furnace, since a cooling gas is introduced from the gas introduction pipe 5 which is provided at the central portion or it is difficult to perform induction heating in the central portion of the susceptor 2, the temperature of the susceptor 2 is generally reduced toward to the central portion. Then, the temperature of the outer circumference of the rotating mounting portion 2b, that is, the outer circumference of the SiC single crystal substrate provided on the mounting portion 2b is reduced by the influence of the reduction in the temperature of the susceptor. Therefore, in a general susceptor-type SiC-CVD furnace, the provided SiC single crystal substrate (wafer) has a temperature gradient in which the temperature of a central portion of the wafer is the highest and is reduced toward the outer circumferential portion of the wafer. The temperature gradient of the SiC single crystal substrate causes compressible stress in the central portion of the SiC single crystal substrate during an epitaxial growth process.

A flange portion 9a which protrudes in a direction in which a diameter increases is provided at the leading end (lower end) of the gas introduction pipe 5. The flange portion 5a is used to make a raw material gas G, which is vertically discharged downward from the lower end of the gas introduction pipe 9, radially flow in the horizontal direction in a space between the flange portion 5a and the susceptor 2 facing the flange portion 5a.

In the CVD apparatus 100, the raw material gas G which is discharged from the lower end of the gas introduction pipe 9 flows radially from the inside to the outside of the reaction space 4. Therefore, it is possible to supply the raw material gas G in parallel to the in-plane of the SiC single crystal substrate. In addition, unnecessary gas in the chamber can be discharged from an exhaust port (not shown) which is provided in the wall of the chamber to the outside of the chamber.

Here, the ceiling 3 is heated to a high temperature by the induction coils 7, but the inner circumferential portion (the central portion in which the opening portion 10b is formed) does not come in contact with the gas introduction pipe 9 which is at a low temperature in order to introduce the raw material gas G In addition, the inner circumferential portion of the ceiling 3 is placed on the supporting member 11 which is attached to the outer circumferential portion of the gas introduction pipe 9 and the ceiling 3 is supported upward in the vertical direction. The ceiling 3 can be moved in the vertical direction.

The temperature gradient of the SiC single crystal substrate varies depending on the flow rate of the gas to be introduced or the position of the induction heating coils. In this embodiment, the flow rate of the gas to be introduced or the position of the induction heating coils are preferably adjusted such that the SiC single crystal substrate has a temperature gradient in which the temperature is the lowest in the central portion of the wafer and increases toward the outer circumferential portion of the wafer.

A distance d1 between the upper surface of the shielding plate 10 and the lower surface of the ceiling 3 is preferably set in the range of 0.5 mm to 1 mm. In this case, the shielding plate 10 prevents a SiC deposit from being deposited on the lower surface of the ceiling 3.

The shielding plate 10 is arranged so as to be separated from the inner wall 1a of the chamber 1 and a distance d2 between an outer circumferential surface 10c of the shielding plate 10 and the inner wall 1a of the chamber 1 in the horizontal direction is preferably in the range of 1.0 mm to 3.0 mm. In this case, the shielding plate 10 is prevented from coming into contact with the wall surface 1a due to thermal expansion during heating.

For example, when the shielding plate is made of silicon carbide, the distance is preferably in a range of 1.0 mm to 2.0 mm.

A distance d3 from an inner wall 10d of the opening portion 10b of the shielding plate 10 to the outer wall 5a of the gas introduction pipe 5 is preferably set in the range of 0.5 mm to 1 mm. In this case, the shielding plate 10 is prevented from coming into contact with the protrusion portion 12 due to thermal expansion during heating and gas is less likely to flow from the inner circumferential side of the shielding plate 10 to the space between the shielding plate 10 and the ceiling 3

A distance d4 between the inner circumferential surface of the ceiling 3 and the outer circumferential surface of the gas introduction pipe 9 is preferably set in the range of 0.5 mm or less. In this case, the gas introduction pipe 5 which is at a low temperature in order to introduce the raw material gas G is affected by radiation heat from the ceiling 3 which is heated at a high temperature by the induction coils 7 as little as possible.

Figure 5:
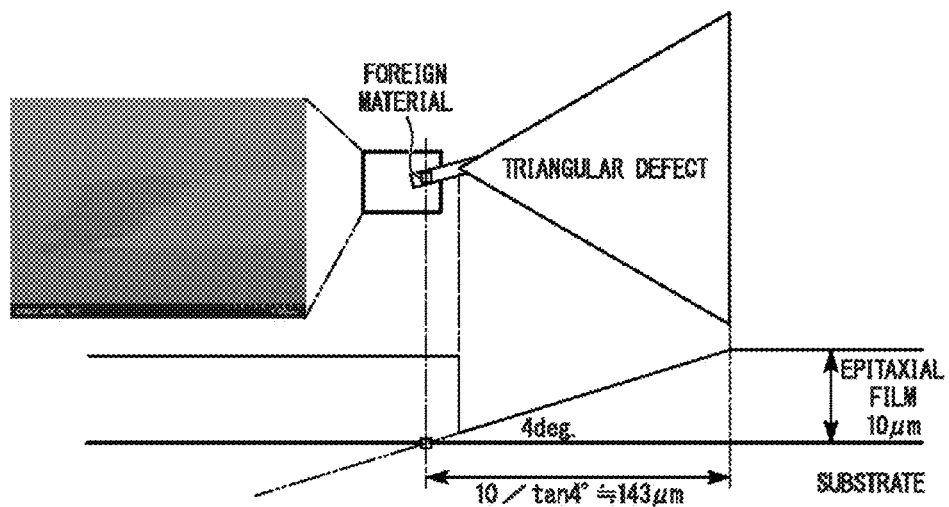
FIG. 5 is a plan view and a cross-sectional view schematically showing a transmission electron microscope (TEM) image of the same SiC epitaxial wafer as that shown in FIG. 4 and the triangular defect.
Figure 6:
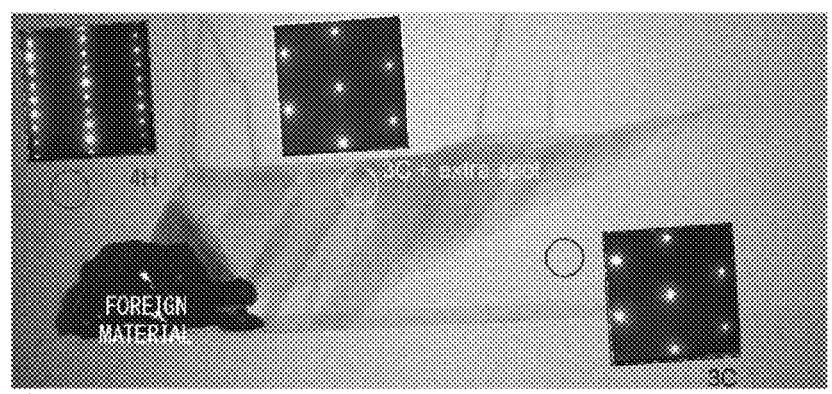
FIG. 6 shows a transmission electron microscope (TEM) image of a SiC epitaxial wafer which is manufactured using a shielding plate that is made of graphite and is coated with a tantalum carbide film.

In this embodiment, as shown in FIG. 20, the ceiling 3 includes the protrusion portion 12 which protrudes from the inner circumferential portion 3d of the lower surface 3c between the inner wall 10d of the opening portion 10b of the shielding plate 10 and the outer wall 5a of the gas introduction pipe 5. The protrusion portion 12 may be formed integrally with the ceiling 3 or separately from the ceiling 3. The protrusion portion 12 is preferably arranged along the inner wall 10d in the opening portion 10b of the shielding plate 10. FIGS. 5 and 7 show only the cross-section of a part of the protrusion portion.

The protrusion portion 12 can prevent the gas of the film material in a gas phase from flowing from the gap between the inner wall 10d of the opening portion 10b of the shielding plate 10 and the outer wall 5a of the gas introduction pipe 5 and from being deposited on the ceiling.

In this embodiment, the protrusion portion 12 is provided. However, the protrusion portion 12 may not be provided.

The SiC-CVD furnace according to this embodiment includes the shielding plate 10. Therefore, even when a material piece of the ceiling 3 falls, the shielding plate 10 can receive the material piece and prevent it from falling on the wafer or the epitaxial layer. Therefore, it is possible to reduce the surface density of triangular defects having the piece of the ceiling 3 as a starting point in the epitaxial layer.

In addition, since at least the lower surface of the shielding plate 10 is coated with one of a silicon carbide film and a pyrolytic carbon film, or the shielding plate 10 is made of silicon carbide, the number of material pieces falling from the shielding plate 10 is less than that falling from the ceiling.

Therefore, when the SiC-CVD furnace is used, it is possible to manufacture a SiC epitaxial wafer with a low surface density of triangular defects having a piece of a member which is placed in the chamber as a starting point, as compared to a case in which the SiC-CVD furnace according to the related art is used.

A SiC-CVD furnace without the shielding plate may be used.

[SiC Epitaxial Wafer Manufacturing Method(Second Embodiment)]

A SiC epitaxial wafer manufacturing method according to a second embodiment manufactures a SiC epitaxial wafer including a SiC epitaxial layer on a SiC substrate using a SiC-CVD furnace which is installed in a glove box and includes a particle number density check process which measures particle number density in the glove box and checks whether the particle number density is reduced to a predetermined value or less before the SiC substrate is placed in the SiC-CVD furnace.

In the SiC epitaxial wafer manufacturing method, it is possible to manage the density (surface density) of triangular defects having particles, which are attached to the SiC substrate in the glove box before the SiC epitaxial film is grown, as starting points. Therefore, it is possible to manufacture a SiC epitaxial wafer in which the density (surface density) of the triangular defects is reduced.

<SiC Epitaxial Wafer>

According to the SiC epitaxial wafer manufacturing method of an embodiment of the invention, it is possible to obtain a SiC epitaxial wafer which includes a SiC epitaxial layer on a SIC single crystal substrate having an off-angle and in which the surface density of triangular defects having particles, which are attached to the SiC substrate, as starting points in the SiC epitaxial layer is in the range of 0.1 to 2.0 pieces/cm$^2$.

A SiC epitaxial wafer according to another embodiment of the invention includes a SiC epitaxial layer on a SiC substrate having an off angle. In the SiC epitaxial layer, the surface density of triangular defects in which a distance from a starting point to an opposite side in the horizontal direction is equal to or greater than (the thickness of the SiC epitaxial layer/tan(x))×90% and equal to or less than (the thickness of the SiC epitaxial layer/tan(x))×110% is 0.05 pieces/cm$^2$ to 0.5 pieces/cm$^2$ (where x indicates the off angle). As shown in Table 1, it is also possible to manufacture a SiC epitaxial wafer in which the surface density of the triangular defects is 0.27 pieces/cm$^2$. From this result, it is also possible to manufacture a SiC epitaxial wafer in which the surface density of the triangular defects is equal to or greater than 0.25 pieces/cm$^2$ and equal to or less than 0.5 pieces/cm$^2$.

In the SiC epitaxial wafer according to the invention, the surface density of triangular defects with a starting point size less than 20 μm is preferably equal to or less than 0.05 pieces/cm$^2$. As shown in Table 1, it is also possible to manufacture a SiC epitaxial wafer in which the surface density of triangular defects with a starting point size less than 20 μm is 0 pieces/cm$^2$. From this result, it is also possible to manufacture a SiC epitaxial wafer in which the surface density of triangular defects is equal to or greater than 0 pieces/cm$^2$ to equal to or less than 0.05 pieces/cm$^2$.

In the SiC epitaxial wafer according to the invention, in the SiC epitaxial layer, the surface density of triangular defects having a piece of a member which is placed in the SiC-CVD furnace as a starting point is preferably equal to or less than 0.5 pieces/cm$^2$. In addition, the piece as the starting point may be made of carbon or silicon carbide.

Hereinafter, in the SiC epitaxial wafer manufacturing method according to the first embodiment of the invention, an example of a series of processes including a process of placing a SiC substrate, a process of forming an epitaxial layer, and a process of measuring the surface density of triangular defects and replacing members when the SiC epitaxial wafers are continuously manufactured will be described.

The example of the processes can also be appropriately applied to a SiC epitaxial wafer manufacturing method according to another embodiment of the invention.

First, a polishing process is performed as pre-processing for the SiC substrate.

<Polishing Process>

In the polishing process, the 4H—SiC single crystal substrate (SiC substrate) which remains on the surface of the wafer in a slice process is polished until the thickness of a lattice disorder layer on the surface of the wafer is 3 nm or less.

The "lattice disorder layer" means a layer in which a striped structure corresponding to an atomic layer (lattice) of the SiC single crystal substrate or a portion of a stripe in the striped structure is not clear in a lattice image (an image in which a crystal lattice can be confirmed) of a TEM (see PTL 5).

The polishing process includes a plurality of polishing processes, such as rough polishing which is generally called lapping, precise polishing which is called polishing, and chemical mechanical polishing (hereinafter, referred to as CMP) which is called ultraprecise polishing. In mechanical polishing before the CMP, preferably, processing pressure is equal to or less than 350 g/cm$^2$ and abrasive particles with a diameter of 5 μm or less are used to suppress the thickness of a damage layer (not only a damage which can be detected as the "lattice disorder layer" in the TEM, but also a portion in which, for example, the distortion of the lattice that cannot be detected by the TEM is deeply present) to 50 nm. Furthermore, in the CMP, polishing slurry preferably includes abrasive particles with an average particle diameter of 10 nm to 150 nm and an inorganic acid. In this case, the polishing slurry preferably has a pH of 2 or less at 20° C. The abrasive particle is silica and 1 mass % to 30 mass % of silica is preferably contained. The inorganic acid is more preferably at least one of a hydrochloric acid, a nitric acid, a phosphoric acid, and a sulfuric acid.

<SiC Substrate Placement Process>

Next, in a SiC substrate placement process, the cover of the furnace is opened and a SiC substrate (wafer) is placed on the wafer mounting portion while gas in the glove box is being circulated. After the SiC substrate is placed, the cover of the furnace is closed. It is preferable that the gas be continuously circulated by the opening and closing of the cover.

It is preferable to use inert gas, such as argon, as the gas in the glove box.

The gas can be circulated by a circulation device through a filter provided in the glove box.

After the cover of the furnace is closed and before epitaxial growth is performed, the circulation may be turned off <Particle Number Density Check Process>

Before the SiC substrate is placed in the SiC-CVD furnace, a particle number density check process may be performed which measures particle number density in the glove box and checks whether the particle number density is equal to or less than a predetermined value.

<Cleaning (Gas Etching) Process>

In a cleaning process, the substrate subjected to the polishing and convex processing is heated at 1400 C. ° to 1800° in a hydrogen atmosphere and cleaning (gas etching) is performed on the surface of the substrate.

The gas etching is performed for 5 minutes to 30 minutes under the conditions that the SiC single crystal substrate is maintained at 1400 C. ° to 1800° C., the flow rate of hydrogen gas is in the range of 40 slm to 120 slm, and pressure is in the range of 100 mbar to 250 mbar.

After the polished SiC single crystal substrate is cleaned, it is set in an epitaxial growth apparatus, for example, a multiple-sheet planetary CVD apparatus for mass production. After hydrogen gas is introduced into the apparatus, pressure is adjusted to 100 mbar to 250 mbar. Then, the temperature of the apparatus increases so that the temperature of the substrate is in the range of 1400 C. ° to 1600° C., preferably, equal to or greater than 1480° C. Then, gas etching is performed on the surface of the substrate with the hydrogen gas for 1 minute to 30 minutes. When the gas etching is performed with the hydrogen gas under these conditions, the amount of etching is about 0.05 µm to 0.4 µm.

SiH4 gas and/or C3H8 gas may be added to the hydrogen gas. In some cases, short step bunching occurs incidentally in a shallow pit which is caused by spiral dislocation. $SiH_4$ gas with a concentration of less than 0.009 mol % is added to the hydrogen gas in order to form a Si-rich environment in a reactor and the gas etching is performed such that the depth of the shallow pit is small. Therefore, it is possible to suppress the incidental occurrence of the short step bunching in the shallow pit.

When $SiH_4$ gas and/or $C_3H_8$ gas is added, it is preferable that the chamber be evacuated to change the atmosphere to a hydrogen gas atmosphere before a film is formed (epitaxial growth).

<Film Forming (Epitaxial Growth) Process>

In a film forming (epitaxial growth) process, the amount of carbon-containing gas and the amount of silicon-containing gas which are required to epitaxially grow silicon carbide are supplied at a predetermined concentration ratio (for example, the concentration ratio C/Si of $SiH_4$ gas and/or $C_3H_8$ gas is 0.7 to 1.2) to the surface of the cleaned substrate (after the temperature increases when the growth temperature of the epitaxial film is higher than the cleaning (gas etching) temperature) to epitaxially grow a SiC film.

It is preferable to simultaneously supply the carbon-containing gas and the silicon-containing gas. In this case, the step bunching is considerably reduced.

Here, the "simultaneous supply" means that the gases are not necessarily supplied at exactly the same time, but a difference between the supply times of the gases is within several seconds.

The flow rate of the $SiH_4$ gas is in the range of 15 sccm to 150 sccm, the flow rate of the $C_3H_8$ gas is in the range of 3.5 sccm to 60 sccm, pressure is in the range of 80 mbar to 250 mbar, the growth temperature is greater than 1600° C. and equal to or less than 1800° C., and the growth speed is in the range of 1 µm to 20 µm per hour. These conditions are determined by controlling the off-angle, the film thickness, the uniformity of carrier concentration, and the growth speed. Nitrogen gas is introduced as a doping gas at the same time as the formation of a film starts to control carrier concentration in the epitaxial layer.

As a method of suppressing the step bunching during the formation of a film, a method has been known which reduces the concentration ratio C/Si of the raw material gas to be supplied in order to increase the migration of Si atoms on the surface of the film. In the invention, the concentration ratio C/Si is in the range of 0.7 to 1.2. In general, the epitaxial layer to be grown has a thickness of about 5 µm to about 20 µm and a carrier concentration of about $2 \times 10^{15}$ cm$^{-3}$ to $15 \times 10^{15}$ cm$^{-3}$.

The growth temperature is in the range of 1400° C. to 1800° C. However, preferably, the growth temperature is equal to or greater than 1600° C. in order to reduce a stacking fault. In addition, preferably, the growth speed increases as the growth temperature increase. Preferably, the growth speed increases as the off-angle of the SiC single crystal substrate increases at the same growth temperature.

For example, (1) when a 4H—SiC single crystal substrate with an off-angle of 0.4° to 2° is used, the following relationship is established between the growth temperature for epitaxially growing the silicon carbide film and the growth speed: when the growth temperature is in the range of 1600° C. to 1640° C., the growth speed is in the range of 1 µm/h to 3 µm/h; when the growth temperature is in a range of 1640° C. to 1700° C., the growth speed is in a range of 3 µm/h to 4 µm/h; and when the growth temperature is in a range of 1700° C. to 1800° C., the growth speed is in a range of 4 µm/h to 10 µm/h.

(2) When a 4H—SiC single crystal substrate with an off-angle of 2° to 5° is used, the following relationship is established between the growth temperature for epitaxially growing the silicon carbide film and the growth speed: when the growth temperature is in a range of 1600° C. to 1640° C., the growth speed is in a range of 2 µm/h to 4 µm/h; when the growth temperature is in a range of 1640° C. to 1700° C., the growth speed is in a range of 4 µm/h to 10 µm/h; and when the growth temperature is in a range of 1700° C. to 1800° C., the growth speed is preferably in a range of 10 µm/h to 20 µm/h.

<Temperature Reduction Process>

In a temperature reduction process, it is preferable to stop the supply of the carbon-containing gas and the silicon-containing gas (for example, a $SiH_4$ gas and a $C_3H_8$ gas) at the same time in order to suppress the deterioration of morphology. After the supply of the gas is stopped, the temperature of the substrate is maintained until the carbon-containing gas and the silicon-containing gas are exhausted. Then, the temperature is reduced.

<Processes of Measuring Surface Density of Triangular Defect and Replacing Member>

After the surface density of triangular defects having a piece of a member which is placed in the chamber as a starting point in a SiC epitaxial layer of a SiC epitaxial wafer is measured regularly (for example, for each production lot or every plurality of production lots) or irregularly, the next SiC epitaxial wafer is manufactured.

The surface density of the triangular defects having the piece of the member which is placed in the chamber as the starting point can be obtained, for example, by shifting the position of a focus from the surface of the epitaxial layer of the SiC epitaxial wafer to the interface (in the depth direction of the film) between the epitaxial layer (film) and the SiC single crystal substrate, finding the triangular defect having the piece of the member which is placed in the chamber as the starting point, and measuring the triangular defect, using an optical microscope. In this embodiment, it is considered that the kind (type) of triangular defects which increase with the repetition of the film forming process includes only a triangular defect having the piece of the member which is placed in the chamber as the starting point and a triangular defect having downfall as the starting point. In general, the starting point of the triangular defect having the downfall as the starting point is clear, but the starting point of the triangular defect having the piece of the member which is placed in the chamber as the starting point is unclear. It is possible to manufacture a SiC epitaxial wafer with a low surface density of the triangular defects having the piece of the member which is placed in the chamber as the starting point by identifying the triangular defect having the downfall as the starting point and managing an increase in the surface density on the basis of the characteristics. When the density of the triangular defects having the piece of the member which is placed in the chamber as the starting point is desired to be strictly measured and managed, the composition of a foreign material in the front of the triangular defect can be analyzed by, for example, energy dispersive X-ray spectroscopy.

When the measurement result shows that the surface density of the triangular defects having the piece of the member which is placed in the chamber as the starting point is greater than a predetermined value, it is preferable to replace the shielding plate 10 and manufacture the next SiC epitaxial wafer. For example, when the surface density of the triangular defects in the previously manufactured SiC epitaxial wafer is about 0.25 pieces/cm$^2$, the shielding plate 10 is replaced and the next SiC epitaxial wafer is manufactured. Then, it is possible to manufacture a SiC epitaxial wafer in which the surface density of the triangular defects is reliably equal to or less than 0.5 pieces/cm$^2$.

EXAMPLES

Hereinafter, the effect of the invention will be described in detail using examples. The invention is not limited to these examples.

Example

In the SiC-CVD furnace shown in FIG. 18, the ceiling which was made of graphite was used and the shielding plate (a diameter of 371 mm and a thickness of 4 mm) which was divided into two parts shown in FIG. 19 and in which a graphite base was coated with a silicon carbide film was used. The shielding plate was arranged at a distance (d1) of 0.5 mm from the ceiling.

A SiC single crystal substrate which had, as a main surface, a Si surface in which a c-plane ((0001) plane) was inclined at an angle of 4° in the <11-20> direction, a diameter of 3 inches (76.2 mm), and a thickness of 350 µm was used as the 4H—SiC single crystal substrate.

Then, the polishing process was performed on the SiC single crystal substrate and organic solvent cleaning, acid and alkali cleaning, and sufficient water washing were performed as preprocessing on the SiC single crystal substrate.

The cover of the SiC-CVD furnace was opened, with circulation turned on in the glove box, and the SiC single crystal substrate was placed on the wafer mounting portion. Then, the cover was closed and the SiC-CVD furnace was evacuated. Then, hydrogen gas was introduced to adjust the atmosphere of the SiC-CVD furnace to a reduced pressure atmosphere of 200 mbar. Then, the temperature increased to 1570° C. and growth was performed at a growth speed of 5 µm/h for one hour to form a SiC epitaxial film with a thickness of 5 µm. In this way, a SiC epitaxial wafer was manufactured.

Hydrogen was used as the carrier gas, a mixed gas of SiH$_4$ and C$_3$H$_8$ was used as the raw material gas, and N$_2$ was supplied as a dopant.

Figure 21:
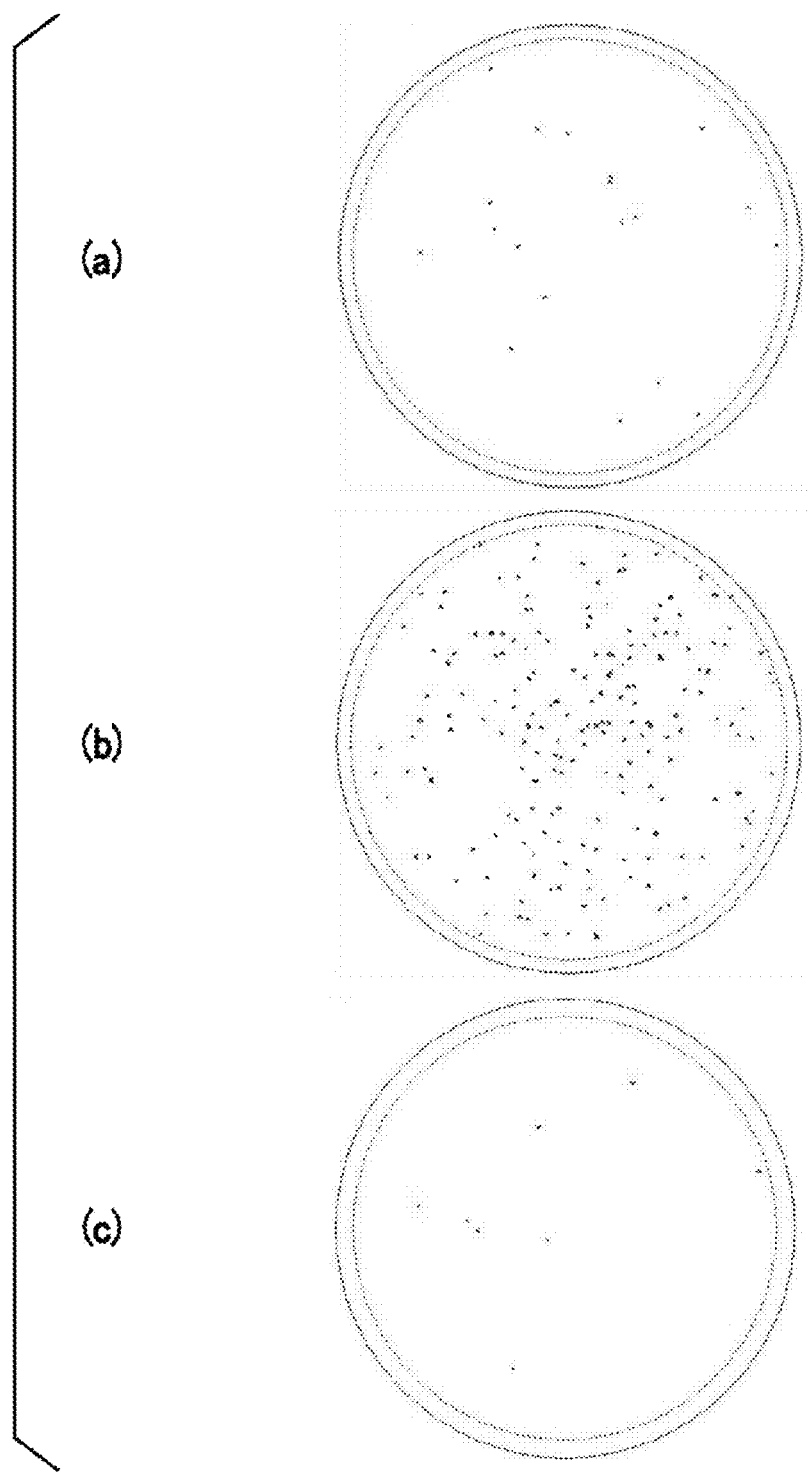
FIGS. 21(a) to 21(c) show a candela image according to an example.

The SiC epitaxial wafer was repeatedly manufactured under the above conditions without replacing the member which is placed in the chamber. FIGS. 21(a) and 21(b) show the candela image of a second production lot and the candela image of an eightieth production lot. Black spots indicate triangular defects.

The number of all kinds of triangular defects was measured from the candela images and the surface density of all kinds of triangular defects was obtained.

In addition, the number of triangular defects having the piece of the member which is placed in the chamber as the starting point was measured by a method of shifting the focus and observing the triangular defects using an optical microscope and the surface density of the triangular defects was obtained.

The surface density of the triangular defects in the SiC epitaxial wafer of the second production lot was 0.5 pieces/cm$^2$ and the surface density of the triangular defects having the piece of the member which is placed in the chamber as the starting point was 0 pieces/cm$^2$.

The surface density of the triangular defects in the SiC epitaxial wafer of the eightieth production lot was 2 pieces/cm$^2$ and the surface density of the triangular defects having the piece of the member which is placed in the chamber as the starting point was 0.5 pieces/cm$^2$.

The surface density of the triangular defects in the SiC epitaxial wafer of the twentieth production lot was 1 pieces/cm$^2$ and the surface density of the triangular defects having the piece of the member which is placed in the chamber as the starting point was 0 pieces/cm$^2$.

FIG. 21(c) shows the candela image of a production lot which is manufactured immediately after the eightieth SiC epitaxial wafer is manufactured and the shielding plate is replaced with a new one. The surface density of the triangular defects was 0.5 pieces/cm$^2$ and the surface density of the triangular defects having the piece of the member which is placed in the chamber as the starting point was 0 pieces/cm$^2$.

This result proved that, when the shielding plate was replaced with a new one, it was possible to reduce the surface density of the triangular defects having the piece of the member which is placed in the chamber as the starting point.

In the production lot in which the surface density of the triangular defects having the piece of the member which is placed in the SiC-CVD furnace as the starting point in the SiC epitaxial layer is 0.5 pieces/cm$^2$, when the shielding plate is replaced with a new one, it is possible to manufacture a SiC epitaxial wafer in which the surface density of the triangular defects is 0.5 pieces/cm$^2$. When the shielding plate is replaced with a new one in the stage in which the number of production lots is less than the above-mentioned number of production lots, it is possible to manufacture a SiC epitaxial wafer in which the surface density of the triangular defects is 0.3 pieces/cm$^2$. In addition, when the shielding plate is replaced with a new one in the stage in which the number of production lots is less than the above-mentioned number of production lots, it is possible to manufacture a SiC epitaxial wafer in which the surface density of the triangular defects is 0.1 pieces/cm$^2$. Furthermore, when the shielding plate is replaced with a new one in the stage in which the number of production lots is less than the above-mentioned number of production lots, it is possible to manufacture a SiC epitaxial wafer in which the surface density of the triangular defects is 0.05 pieces/cm$^2$.

When the number of production lots in which the shielding plate is replaced with a new one is appropriately selected, it is possible to manufacture a SiC epitaxial wafer in which the surface density of the triangular defects having the piece of the member which is placed in the SiC-CVD furnace as the starting point in the SiC epitaxial layer is equal to or greater than 0 pieces/cm$^2$ and equal to or less than 0.5 pieces/cm$^2$. Similarly, it is possible to manufacture a SiC epitaxial wafer in which the surface density of the triangular defects is equal to or greater than 0.05 pieces/cm$^2$ and equal to or less than 0.5 pieces/cm$^2$. Similarly, it is possible to manufacture a SiC epitaxial wafer in which the surface density of the triangular defects is equal to or greater than 0.05 pieces/cm$^2$ and equal to or less than 0.3 pieces/cm$^2$. Similarly, it is possible to manufacture a SiC epitaxial wafer in which the surface density of the triangular defects is equal to or greater than 0.05 pieces/cm$^2$ and equal to or less than 0.1 pieces/cm$^2$.

Comparative Example 1

In Comparative Example 1, manufacturing conditions were the same as those in the example except that a shielding plate obtained by coating a graphite base with a tantalum carbide film was used in the SiC-CVD furnace used in the example.

Figure 22:
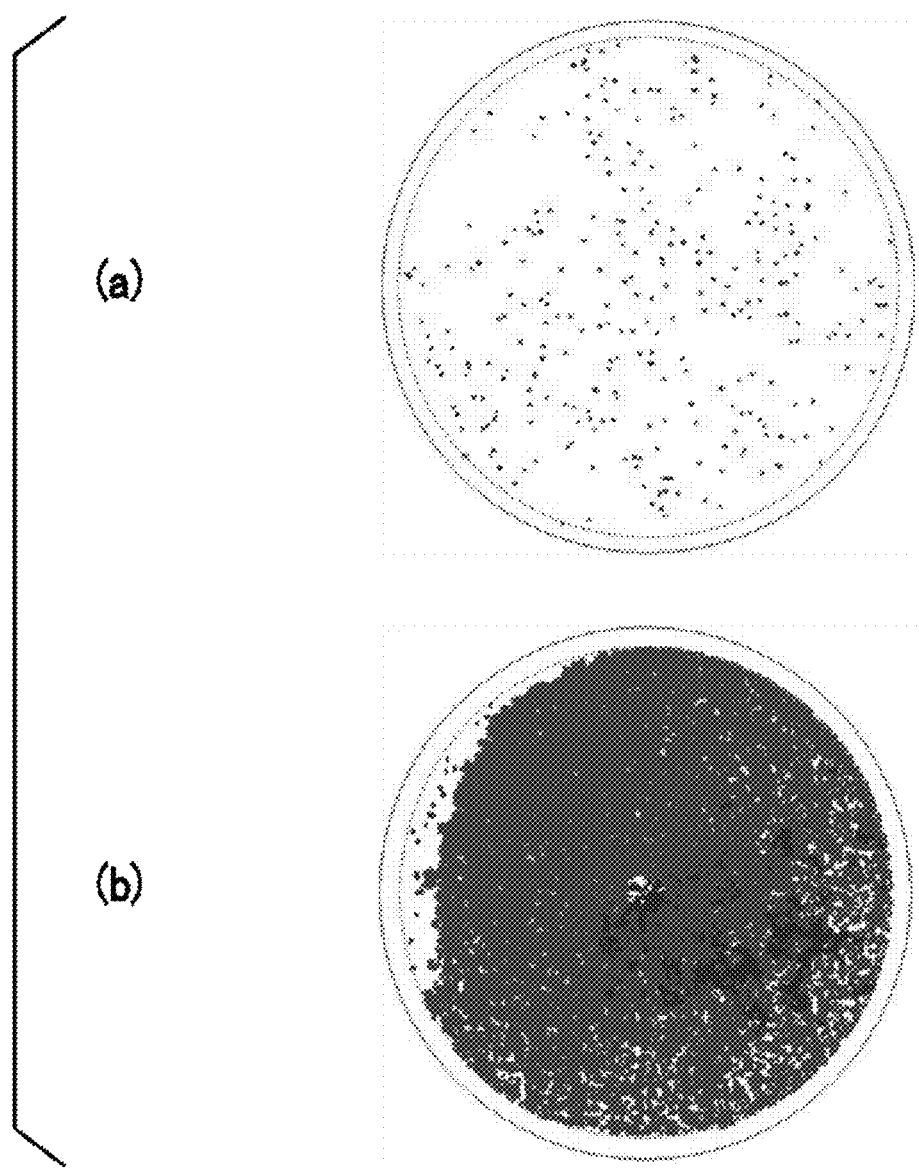
FIG. 22(a) shows a candela image according to Comparative Example 1 and FIG. 22(b) shows a candela image according to Comparative Example 2.
Figure 23:
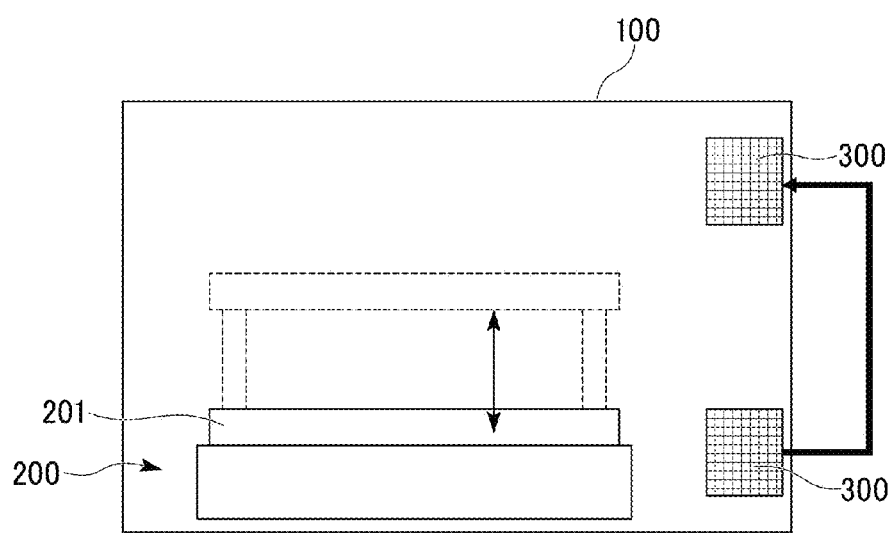
FIG. 23 is a diagram schematically showing the arrangement of a chamber (SiC-CVD furnace) in a glove box.

A SiC epitaxial wafer was repeatedly manufactured under these conditions without replacing the member which is placed in the chamber. FIG. 22(a) shows the candela image of a twentieth production lot.

The surface density of all kinds of triangular defects in the SiC epitaxial wafer was 2 pieces/cm$^2$ and the surface density of the triangular defects having the piece of the member which is placed in the chamber as the starting point was 1 pieces/cm$^2$.

Even though the number of repetitions of the SiC epitaxial wafer manufacturing process is the same as that in the example, both the surface density of all kinds of triangular defects and the surface density of the triangular defects having the piece of the member which is placed in the chamber as the starting point were higher than those in the example.

This result proved that, when the shielding plate having the graphite base coated with the silicon carbide film was used, it was possible to reduce both the surface density of all kinds of triangular defects and the surface density of the triangular defects having the piece of the member which is placed in the chamber as the starting point, as compared to when the shielding plate having the graphite base coated with the tantalum carbide was used.

Comparative Example 2

In Comparative Example 2, the manufacturing conditions were the same as those in the example except that the shielding plate was not used in the SiC-CVD furnace used in the example.

A SiC epitaxial wafer was repeatedly manufactured under these conditions without replacing the member which is placed in the chamber. FIG. 22(b) shows the candela image of a twentieth production lot.

The surface density of all kinds of triangular defects in the SiC epitaxial wafer was 100 pieces/cm$^2$ and the surface density of the triangular defects having a piece of the member which is placed in the chamber as a starting point was 90 pieces/cm$^2$.

Even though the number of repetitions of the SiC epitaxial wafer manufacturing process is the same as that in the example, both the surface density of all kinds of triangular defects and the surface density of the triangular defects having the piece of the member which is placed in the chamber as the starting point were significantly higher than those in the example.

This result proved that the use of the shielding plate made it possible to significantly reduce the surface density of all kinds of triangular defects and the surface density of the triangular defects having the piece of the member which is placed in the chamber as the starting point.

INDUSTRIAL APPLICABILITY

It is possible to provide a method of manufacturing a SiC epitaxial wafer with a low surface density of triangular defects which have particles attached to a SiC substrate as starting points.

REFERENCE SIGNS LIST

1: CHAMBER (SIC-CVD FURNACE)
1a: INNER WALL
2: SUSCEPTOR
2b: MOUNTING PORTION
3: CEILING
4: REACTION SPACE
6, 7: INDUCTION COIL (HEATING MEANS)
10: SHIELDING PLATE
10a: OUTER CIRCUMFERENTIAL PORTION
10A, 10B: SHIELDING PLATE
11: SUPPORTING PORTION

The invention claimed is:
1. A method of manufacturing a SiC epitaxial wafer including a SiC epitaxial layer on a SiC substrate using a SiC-CVD furnace which is installed in a glove box, comprising:
   a SiC substrate placement step of placing the SiC substrate in the SiC-CVD furnace while circulating gas in the glove box,
   wherein the SiC-CVD furnace includes a susceptor that has a wafer mounting portion on which a wafer is placed, a ceiling that faces an upper surface of the susceptor such that a reaction space is formed between the ceiling and the susceptor, and a shielding plate that is provided so close to a lower surface of the ceiling that a deposit is prevented from being attached to the lower surface of the ceiling,
   a surface of the shielding plate which faces the susceptor is coated with one of a silicon carbide film and a pyrolytic carbon film, or the shielding plate is made of silicon carbide, and
   the method further includes a step of measuring the surface density of triangular defects including a piece of a member which is placed in the SiC-CVD furnace as a starting point in a SiC epitaxial film of a previously manufactured SiC epitaxial wafer and manufacturing the next SiC epitaxial wafer.
2. The method of manufacturing a SiC epitaxial wafer according to claim 1, wherein the gas is circulated before and after the SiC substrate is placed in the SiC-CVD furnace.

3. The method of manufacturing a SiC epitaxial wafer according to claim 2,
wherein the gas is circulated at least 3 minutes before the SiC substrate is placed in the SiC-CVD furnace.

4. The method of manufacturing a SiC epitaxial wafer according to claim 1,
wherein the SiC substrate placement step is performed after it is checked that particle number density in the glove box is equal to or less than a predetermined value.

5. The method of manufacturing a SiC epitaxial wafer according to claim 1,
wherein, when the measurement result shows that the surface density of the triangular defects including a piece of a member which is placed in the SiC-CVD furnace as the starting point is greater than a predetermined value, the shielding plate is replaced and the next SiC epitaxial wafer is manufactured.

6. A method of manufacturing a SiC epitaxial wafer including a SiC epitaxial layer on a SiC substrate using a SiC-CVD furnace which is installed in a glove box, comprising:

a SiC substrate placement step of placing the SiC substrate in the SiC-CVD furnace while circulating gas in the glove box,
wherein the SiC-CVD furnace includes a susceptor that has a wafer mounting portion on which a wafer is placed and a ceiling that faces an upper surface of the susceptor such that a reaction space is formed between the ceiling and the susceptor,
a surface of the ceiling which faces the susceptor is coated with one of a silicon carbide film and a pyrolytic carbon film, or the ceiling is made of silicon carbide, and
the method further includes a step of measuring the surface density of triangular defects including a piece of a member which is placed in the SiC-CVD furnace as a starting point in a SiC epitaxial film of a previously manufactured SiC epitaxial wafer and manufacturing the next SiC epitaxial wafer.

7. The method of manufacturing a SiC epitaxial wafer according to claim 6,
wherein, when the measurement result shows that the surface density of the triangular defects including a piece of a member which is placed in the SiC-CVD furnace as the starting point is greater than a predetermined value, the ceiling is replaced and the next SiC epitaxial wafer is manufactured.

* * * * *